(12) United States Patent
Li et al.

(10) Patent No.: US 11,475,949 B2
(45) Date of Patent: Oct. 18, 2022

(54) COMPUTING ARRAY BASED ON 1T1R DEVICE, OPERATION CIRCUITS AND OPERATING METHODS THEREOF

(71) Applicant: HUAZHONG UNIVERSITY OF SCIENCE AND TECHNOLOGY, Hubei (CN)

(72) Inventors: Yi Li, Hubei (CN); Zhuorui Wang, Hubei (CN); Xiangshui Miao, Hubei (CN); Yaxiong Zhou, Hubei (CN); Long Cheng, Hubei (CN)

(73) Assignee: HUAZHONG UNIVERSITY OF SCIENCE AND TECHNOLOGY, Hubei (CN)

( * ) Notice: Subject to any disclaimer, the term of this patent is extended or adjusted under 35 U.S.C. 154(b) by 876 days.

(21) Appl. No.: 16/336,900

(22) PCT Filed: Jun. 7, 2018

(86) PCT No.: PCT/CN2018/090247
§ 371 (c)(1),
(2) Date: Mar. 26, 2019

(87) PCT Pub. No.: WO2019/114217
PCT Pub. Date: Jun. 20, 2019

(65) Prior Publication Data
US 2021/0327505 A1     Oct. 21, 2021

(30) Foreign Application Priority Data
Dec. 17, 2017   (CN) ......................... 201711358553.4

(51) Int. Cl.
*G11C 11/00*     (2006.01)
*G11C 13/00*     (2006.01)
(Continued)

(52) U.S. Cl.
CPC ........ *G11C 13/0069* (2013.01); *G06F 7/4824* (2013.01); *G11C 13/004* (2013.01);
(Continued)

(58) Field of Classification Search
CPC ............ G11C 13/0069; G11C 13/0026; G11C 13/0028; G11C 13/004; G11C 13/0061;
(Continued)

(56) References Cited

U.S. PATENT DOCUMENTS 9,792,987 B1 * 10/2017 Chou ................. G11C 13/0069
2011/0007553 A1 * 1/2011 Takagi ............... G11C 13/0064
365/189.16

FOREIGN PATENT DOCUMENTS

| CN | 100345300 | 10/2007 |
| CN | 101908373 | 12/2010 |
| CN | 106374912 | 2/2017 |

OTHER PUBLICATIONS

"International Search Report (Form PCT/ISA/210)", dated Sep. 13, 2018, pp. 1-5.

* cited by examiner

*Primary Examiner* — Hoai V Ho
*Assistant Examiner* — Minh Dinh
(74) *Attorney, Agent, or Firm* — JCIPRNET

(57) ABSTRACT

The present invention discloses a computing array based on 1T1R device, operation circuits and operating methods thereof. The computing array has 1T1R arrays and a peripheral circuit; the 1T1R array is configured to achieve operation and storage of an operation result, and the peripheral circuit is configured to transmit data and control signals to control operation and storage processes of the 1T1R arrays; the operation circuits are respectively configured to implement a 1-bit full adder, a multi-bit step-by-step carry adder and optimization design thereof, a 2-bit data selector, a (Continued)

multi-bit carry select adder and a multi-bit pre-calculation adder; and in the operating method corresponding to the operation circuit, initialized resistance states of the 1T1R devices, word line input signals, bit line input signals and source line input signals are controlled to complete corresponding operation and storage processes.

19 Claims, 7 Drawing Sheets

(51) Int. Cl.
 *G06F 7/48* (2006.01)
 *H03K 19/21* (2006.01)
(52) U.S. Cl.
 CPC ...... *G11C 13/0026* (2013.01); *G11C 13/0028* (2013.01); *G11C 13/0061* (2013.01); *H03K 19/21* (2013.01)
(58) Field of Classification Search
 CPC .............. G11C 7/1006; G11C 2213/79; G11C 2213/82; G11C 13/0021; G06F 7/4824; G06F 7/501; G06F 7/506; G06F 2207/4828; H03K 19/21; H03K 19/1733
 USPC ........................................................ 365/148
 See application file for complete search history.

COMPUTING ARRAY BASED ON 1T1R DEVICE, OPERATION CIRCUITS AND OPERATING METHODS THEREOF

CROSS-REFERENCE TO RELATED APPLICATION

This application is a 371 application of an international PCT application serial no. PCT/CN2018/090247, filed on Jun. 7, 2018, which claims priority to and the benefit of China Patent Application No. CN201711358553.4, filed on Dec. 17, 2017. The entirety of each of the above-mentioned patent applications is hereby incorporated by reference herein and made a part of this specification.

BACKGROUND OF THE INVENTION

Technical Field

The present invention belongs to the field of microelectronic devices, and more particularly relates to a computing array based on 1T1R device, operation circuits and operating methods thereof.

Description of the Related Art

In the era of big data, the Moore's Law for integrated circuits, which improve the computational performance through the size reduction of nano-transistor logic devices, has been difficult to continue. The bottleneck problem of storage and computation separation in the traditional von Neumann computing architecture is highlighted, and the existing architecture and hardware cannot meet the demand for superior computing power in explosive growth of information.

Resistive Random Access Memory (RRAM), which has the characteristics such as low power consumption, high speed, high integration as well as information storage and calculation functions, can break through the limit of Moore's Law in the development of existing electronic devices, and thus is widely used in improving the speed of computer data processing. In the existing industrial integration technology, RRAM is mainly applied in the 1T1R device structure.

Chinese Patent No. 2014203325960 proposed a non-volatile Boolean logic operation circuit and an operating method thereof, which realizes a complete set of non-volatile Boolean logic operations through a back-to-back RRAM structure, but cannot realize circuit cascading, circuit integration and more complex computing functions.

SUMMARY OF THE INVENTION

In view of the above-described defects or improvement requirements in the art, the present invention provides a computing array based on 1T1R device, operation circuits and operating methods thereof, which aim to achieve a complete set of non-volatile Boolean logic operations, and to achieve more complex computing functions, while improving the compatibility of the computing circuits and simplifying the operation methods.

In order to achieve the above objective, according to a first aspect of the present invention, there is provided a computing array based on 1T1R device, which comprises: one or more 1T1R arrays and a peripheral circuit; the 1T1R array is configured to achieve operation and storage of an operation result, and the peripheral circuit is configured to transmit data and control signals to control operation and storage processes of the 1T1R arrays.

The 1T1R array includes 1T1R devices arranged in an array, word lines WL, bit lines BL and source lines SL; resistance states of the 1T1R devices include: High Resistance H and Low Resistance L; the 1T1R devices realize storage and processing of information through different resistance states; and the 1T1R devices in the same row are connected to the same word line, the 1T1R devices in the same column are connected to the same bit line and source line, and through applying different signals to the word lines WL, the bit lines BL and the source lines SL, different operations are achieved and operation results are stored.

The 1T1R device includes a transistor and a resistive element; the transistor includes a substrate, a source, a drain, an insulating layer and a gate, in which the source is connected to the source line SL, and the gate is connected to the word line WL; the resistive element includes two end electrodes, one of which is connected to the bit line BL and the other of which is connected to the drain of the transistor; and the resistive element has a stacked structure with a nonvolatile resistance transition characteristic.

The resistance state of the 1T1R device can be reversibly transformed under the stimulation of an applied signal, namely, with the stimulation of an applied signal, the resistance state of the 1T1R device can be transformed from High Resistance to Low Resistance, and with the stimulation of another applied signal, the resistance state of the 1T1R device can be transformed from Low Resistance to High Resistance. By using the two resistance states of the 1T1R device, storage and processing of information can be achieved.

In a first embodiment of the first aspect of the present invention, the resistive element of the 1T1R device is RRAM; RRAM includes: an upper electrode, a functional layer and a lower electrode; the upper electrode is connected to the bit line BL, and the lower electrode is connected to the drain of the transistor.

The peripheral circuit includes: a state controller, a word line decoder, a source line decoder, a bit line decoder, a signal amplifier, a control signal modem and a data transmission circuit, wherein:

The state controller has a data input/output terminal Data, an address input terminal Address, a clock signal input terminal CLK, a result input terminal, a word line output terminal, a bit line output terminal, a source line output terminal and a secondary output terminal; the data input/output terminal Data of the state controller is configured to input calculated data on the one hand and output a calculated result on the other hand, the address input terminal Address of the state controller is configured to input address information of a selected device, the clock signal input terminal CLK of the state controller is configured to input a clock signal for controlling a calculation timing, and the result input terminal of the state controller is configured to input a calculated result generated by a pre-stage circuit; the state controller generates a control signal according to the input data, address information, clock signal and calculated result, or outputs a final calculated result.

An input terminal of the word line decoder is connected to the word line output terminal of the state controller, an output terminal of the word line decoder is connected to a word line of the 1T1R array; the word line decoder decodes the control signal generated by the state controller to obtain a word line control signal, and inputs the word line control signal to the 1T1R devices through the word line of the 1T1R array.

An input terminal of the bit line decoder is connected to the bit line output terminal of the state controller, an output terminal of the bit line decoder is connected to a bit line of the 1T1R array; the bit line decoder decodes the control signal generated by the state controller to obtain a bit line control signal, and inputs the bit line control signal to the 1T1R devices through the bit line of the 1T1R array.

An input terminal of the source line decoder is connected to the source line output terminal of the state controller, an output terminal of the source line decoder is connected to a source line of the 1T1R array; the source line decoder decodes the control signal generated by the state controller to obtain a source line control signal, and inputs the source line control signal to the 1T1R devices through the source line of the 1T1R array.

The word line control signal, the bit line control signal and the source line control signal are commonly applied to the 1T1R array to control states of the 1T1R devices in the 1T1R array.

An input terminal of the signal amplifier is connected to a bit line of the 1T1R array; when data information stored in the 1T1R array is read, the signal amplifier converts an acquired resistance signal stored by the 1T1R device into a voltage signal and then outputs it to the control signal modem.

A first input terminal of the control signal modem is connected to the secondary output terminal of the state controller, a second input terminal of the control signal modem is connected to an output terminal of the signal amplifier; the control signal modem decodes the control signal generated by the state controller to obtain a control signal of a next-stage circuit, or directly transmits the data voltage signal output by the signal amplifier; the next-stage circuit is the next 1T1R device in the same 1T1R array, or a next 1T1R array in the compute array.

An input terminal of the data transmission circuit is connected to an output terminal of the control signal modem; the data transmission circuit feeds back the data voltage signal output by the control signal modem to the state controller through the result input terminal of the state controller, or transmits the control signal output from the control signal modem to the word line decoder, the bit line decoder and the source line decoder of the next-stage circuit.

The data input/output terminal Data, the address input terminal Address and the clock signal input terminal CLK of the state controller respectively serve as a data input/output terminal, an address input terminal and a clock signal input terminal of the computing array.

In the computing array based on 1T1R device, applied voltage pulses are used as input signals to perform logic operation, and the result of the logic operation is characterized by the final resistance state of the 1T1R device; the result of the logic operation can be non-volatilely stored in the resistance state of the device, the resistance state can be read by a read signal of a small current (generally at the nanoampere level) or a small voltage (generally 0.2V or less), and the resistance signal can be erased by applying a voltage pulse with a certain amplitude and pulse width.

In the computing array based on 1T1R device, Boolean logic operations are achieved in the 1T1R devices by applying different voltage pulse signals to the word lines, source lines and bit lines of the 1T1R array. The initial resistance state of the 1T1R device is defined as a logic signal I, in which I=0 when the initial resistance state of the 1T1R device is High Resistance, and I=1 when the initial resistance state of the 1T1R device is Low Resistance; the word line level voltage is defined as a logic signal $V_{WL}$, in which $V_{WL}=0$ when a zero-level pulse is applied to the word line, and $V_{WL}=1$ when a forward voltage pulse is applied to the word line; the bit line level voltage is defined as a logic signal $V_{BL}$, in which $V_{BL}=0$ when a zero-level pulse is applied to the bit line, and $V_{BL}=1$ when a forward voltage pulse is applied to the bit line; the source line level voltage is defined as a logic signal $V_{SL}$, in which $V_{SL}=0$ when a zero-level pulse is applied to the source line, and $V_{SL}=1$ when a forward voltage pulse is applied to the source line; the result of the logical operation in the 1T1R device is non-volatilely stored in the 1T1R device, and when information stored in the 1T1R device is read, the resistance state of the 1T1R device is defined as a logic signal R, in which R=0 when the resistance state of the 1T1R device is High Resistance, and R=1 when the resistance state of the 1T1R device is Low Resistance; and a logical relationship between the logic signal I, the logic signal $V_{WL}$, the logic signal $V_{BL}$, the logic signal $V_{SL}$, and the logic signal R is:

$$R = I \cdot \overline{V_{WL}} + I \cdot V_{WL} \cdot V_{BL} + I \cdot V_{WL} \cdot \overline{V_{BL}} \cdot \overline{V_{SL}} + \bar{I} \cdot V_{WL} \cdot V_{BL} \cdot \overline{V_{ST}}$$

In the computing array based on 1T1R device, Boolean logic operation are implemented in a single 1T1R device, and specifically, the operating method includes the following steps.

(1) Initializing the 1T1R device to obtain a logic signal I.

(2) Respectively applying a voltage pulse signal to a word line, a source line and a bit line to obtain a logic signal $V_{WL}$, a logic signal $V_{SL}$ and a logic signal $V_{BL}$.

(3) Reading a result of the logical operation, that is, a logic signal R.

By controlling values of the logic signals I, $V_{WL}$, $V_{BL}$ and $V_{SL}$, the following 16 Boolean logic operations can be implemented:

implementation of logic 0: I=0, $V_{WL}=0$, $V_{BL}=p$ and $V_{SL}=q$;

implementation of logic 1: I=1, $V_{WL}=0$, $V_{BL}=p$ and $V_{SL}=q$;

implementation of p logic: I=p, $V_{WL}=0$, $V_{BL}=0$ and $V_{SL}=q$;

implementation of p logic: I=q, $V_{WL}=0$, $V_{BL}=0$ and $V_{SL}=p$;

implementation of $\bar{p}$ logic: I=$\bar{p}$, $V_{WL}=0$, $V_{BL}=p$ and $V_{SL}=q$;

implementation of $\bar{q}$ logic: I=$\bar{q}$, $V_{WL}=0$, $V_{BL}=p$ and $V_{SL}=q$;

implementation of p+q logic: I=p, $V_{WL}=1$, $V_{BL}=p$ and $V_{SL}=0$;

implementation of $\overline{p}+\overline{q}$ logic: I=1, $V_{WL}=p$, $V_{BL}=0$ and $V_{SL}=q$;

implementation of p·q logic: I=0, $V_{WL}=p$, $V_{BL}=q$ and $V_{SL}=0$;

implementation of $\bar{p}\cdot\bar{q}$ logic: I=$\bar{q}$, $V_{WL}=p$, $V_{BL}=q$ and $V_{SL}=1$;

implementation of p+$\bar{q}$ logic: I=1, $V_{WL}=1$, $V_{BL}=p$ and $V_{SL}=q$;

implementation of $\bar{p}+\bar{q}$ logic: I=1, $V_{WL}=p$, $V_{BL}=q$ and $V_{SL}=1$;

implementation of $\bar{p}\cdot q$ logic: I=q, $V_{WL}=1$, $V_{BL}=0$ and $V_{SL}=p$;

implementation of p·$\bar{q}$ logic: I=p, $V_{WL}=1$, $V_{BL}=0$ and $V_{SL}=q$;

implementation of $\bar{p}\cdot q + p\cdot\bar{q}$ logic: I=p, $V_{WL}=q$, $V_{BL}=\bar{p}$ and $V_{SL}=p$; and implementation of p·q+$\bar{p}\cdot\bar{q}$ logic: I=$\bar{q}$, $V_{WL}=p$, $V_{BL}=q$ and $V_{SL}=\bar{q}$.

Further, by inputting a logic signal $V_{WL}=1$ via the word line, a logic signal $V_{BL}=V_{read}$ via the bit line and a logic signal $V_{SL}=0$ via the source line, the logic signal stored in the 1T1R device can be read, in which $V_{read}$ is a voltage pulse signal applied when the resistance state of the 1T1R device is read.

In the present invention, symbols similar to I, $V_{WL}$, $V_{BL}$ and $V_{SL}$ are used to denote logical signals with the same concept, and signals corresponding to different 1T1R devices are distinguished only by different subscripts According to a second aspect of the present invention, there is provided an operation circuit based on the computing array for implementing a 1-bit full adder, in which a sum $s_0$ and a high-order carry $c_1$ are calculated according to a logic signal a, a logic signal b and a low-order carry $c_0$ that are input; the operation circuit comprises: a 1T1R array $A_1$, a 1T1R array $A_2$ and a 1T1R array $A_3$; the 1T1R array $A_1$ includes a 1T1R device $R_b$ for calculating and storing intermediate data $s_0^*$, a word line signal corresponding to $R_b$ is $V_{WLb}$, a bit line signal corresponding to $R_b$ is $V_{BLb}$ and a source line signal corresponding to $R_b$ is $V_{SLb}$; the 1T1R array $A_2$ includes a 1T1R device $R_c$ for calculating and storing the high-order carry $c_1$, a word line signal corresponding to $R_c$ is $Y_{WLc}$, a bit line signal corresponding to $R_c$ is $V_{BLc}$ and a source line signal corresponding to $R_c$ is $V_{SLc}$; the 1T1R array $A_3$ includes a 1T1R device $R_s$ for calculating and storing the sum $s_0$, a word line signal corresponding to $R_s$ is $V_{WLs}$, a bit line signal corresponding to $R_s$ is $V_{BLs}$ and a source line signal corresponding to $R_s$ is $V_{SLs}$; and the intermediate data $s_0^*$ calculated by the 1T1R array $A_1$ and the high-order carry $c_1$ calculated by the 1T1R array $A_2$ are converted by the signal amplifier and the control signal modem, and then transmitted to the 1T1R array $A_3$ through the data transmission circuit.

In conjunction with the second aspect of the present invention, the present invention further provides an operating method based on the operation circuit, which comprises:

(S1-1) Inputting logic signals $V_{WLc}=1$, $V_{BLc}=c_0$ and $V_{SLc}=\overline{c_0}$ to write the input logic signal $c_0$ into $R_c$ of the 1T1R array $A_2$; inputting logic signals $V_{WLb}=1$, $V_{BLb}=a_0$ and $V_{SLb}=\overline{a_0}$ to write the input logic signal $a_0$ into $R_b$ of the 1T1R array $A_1$; inputting logic signals $V_{WLs}=1$, $V_{BLs}=a_0$ and $V_{SLs}=\overline{a_0}$ to write the input logic signal $a_0$ into $R_s$ of the 1T1R array $A_3$.

(S1-2) Inputting logic signals $V_{WLc}=1$, $V_{BLc}=a_0$ and $V_{SLc}=\overline{b_0}$ to calculate a high-order carry $c_1=a_0 \cdot b_0 + a_0 \cdot c_0 + c_0 \cdot b_0$ and store $c_1$ in $R_c$ of the 1T1R array $A_2$; inputting logic signals $V_{WLb}=b_0$, $V_{BLb}=\overline{a_0}$ and $V_{SLb}=a_0$ to calculate an intermediate result $s_0^*=a_0 \oplus b_0$ and store $s_0^*$ in $R_b$ of the 1T1R array $A_1$; inputting logic signals $V_{WLs}=b_0$, $V_{BLs}=\overline{a_0}$ and $V_{SLs}=a_0$ to calculate an intermediate result $s_0^*$ and store $s_0^*$ in $R_s$ of the 1T1R array $A_3$.

(S1-3) Reading the logic signal $c_1$ stored in $R_c$ of the 1T1R array $A_2$; reading the logic signal $s_0$ stored in $R_b$ of the 1T1R array $A_1$; inputting logic signals $V_{WLs}=c_0$, $V_{BLs}=\overline{s_0^*}$ and $V_{SLs}=s_0^*$ to calculate a sum $s_0=a_0 \oplus b_0 \oplus c_0$ and store $s_0$ in $R_s$ of the 1T1R array $A_3$.

(S1-4) reading the logic signal $s_0$ stored in $R_s$ of the 1T1R array $A_3$.

According to a third aspect of the present invention, there is provided an operation circuit based on the computing array for implementing a multi-bit step-by-step carry adder, in which sums $s_{0 \sim n-1}$ and carry information $c_n$ are calculated according to input data $a_{0 \sim n-1}$ and $b_{0 \sim n-1}$ and carry information $c_0$, and n represents the number of bits of the operation data, the operation circuit comprises: a 1T1R array $D_1$, a 1T1R array $D_2$ and a 1T1R array $D_3$; the 1T1R array $D_1$ includes n 1T1R devices $R_{0b} \sim R_{(n-1)b}$ for calculating and storing intermediate results $s_{0 \sim n-1}^*$, word line control signals corresponding to $R_{0b} \sim R_{(n-1)b}$ are respectively $V_{WL0b} \sim V_{WL(n-1)b}$, bit line control signals corresponding to $R_{0b} \sim R_{(n-1)b}$ are respectively $V_{BL0b} \sim V_{BL(n-1)b}$, and source line control signals corresponding to $R_{0b} \sim R_{(n-1)b}$ are respectively $V_{SL0b} \sim V_{SL(n-1)b}$; the 1T1R array $D_1$ is used for data backup; the 1T1R array $D_2$ includes a 1T1R device $R_n$ for calculating and storing carry data $c_i$ (i is an integer from 0 to 8), a word line control signal corresponding to $R_n$ is $V_{WLn}$, a bit line control signal corresponding to $R_n$ is $V_{BLn}$ and a source line control signal corresponding to $R_n$ is $V_{SLn}$; the 1T1R array $D_3$ includes n 1T1R devices $R_0 \sim R_{n-1}$ for calculating and storing addition operation results $s_{0 \sim n-1}$, word line control signals corresponding to $R_0 \sim R_{n-1}$ are respectively $V_{WL0} \sim V_{WL(n-1)}$, bit line control signals corresponding to $R_0 \sim R_{n-1}$ are respectively $V_{BL0} \sim V_{BL(n-1)}$, and source line control signals corresponding to $R_0 \sim R_{n-1}$ are respectively $V_{SL0} \sim V_{SL(n-1)}$; and the intermediate data $s_{0 \sim n-1}^*$ calculated by the 1T1R array $D_1$ and the carry information $c_i$ calculated by the 1T1R array $D_2$ are converted by the signal amplifier and the control signal modem, and then transmitted to the 1T1R array $D_3$ through the data transmission circuit.

In conjunction with the third aspect of the present invention, the present invention further provides an operating method based on the operation circuit, which comprises:

(S2-1) Inputting logic signals $V_{WL0 \sim (n-1)}=1$, $V_{BL0 \sim (n-1)}=a_{0 \sim n-1}$ and $V_{SL0 \sim (n-1)}=\overline{a_{0 \sim n-1}}$ to write the input data $a_{0 \sim n-1}$ into $R_{0 \sim n-1}$ of the 1T1R array $D_3$; inputting logic signals $V_{WLn}=1$, $V_{BLn}=c_0$ and $V_{SLn}=\overline{c_0}$ to write the carry information $c_0$ into $R_n$ of the 1T1R array $D_2$, a word line input signal, a bit line input signal and a source line input signal of the 1T1R array $D_1$ being the same as that of the 1T1R array $D_3$.

(S2-2) Inputting logic signals $V_{WL0 \sim (n-1)}=b_{0 \sim n-1}$, $V_{BL0 \sim (n-1)}=\overline{a_{0 \sim n-1}}$ and $V_{SL0 \sim (n-1)}=a_{0 \sim n-1}$ to calculate intermediate results $s_{0 \sim n-1}=a_{0 \sim n-1} \oplus b_{0 \sim n-1}$ and store $s_{0 \sim n-1}^*$ in $R_{0 \sim n-1}$ of the 1T1R array $D_3$; inputting logic signals $V_{WL0b \sim (n-1)b}=b_{0 \sim n-1}$, $V_{BL0b \sim (n-1)b}=\overline{a_{0 \sim n-1}}$ and $V_{SL0b \sim (n-1)b}=a_{0 \sim n-1}$ to calculate intermediate results $s_{0 \sim n-1}^*$ and store $s_{0 \sim n-1}^*$ in $R_{0b \sim (n-1)b}$ of the 1T1R array $D_1$; inputting logic signals $V_{WLn}=1$, $V_{BLn}=a_0$ and $V_{SLn}=\overline{b_0}$ to calculate $c_1=a_0 \cdot b_0 + a_0 \cdot c_0 + c_0 \cdot b_0$ and store $c_1$ in $R_n$ of the 1T1R array $D_2$.

(S2-3) Reading $s_0^*$ from $R_{0b}$ of the 1T1R array $D_1$, and reading $s_1^*$ from $R_{1b}$ of the 1T1R array D1; inputting logic signals $V_{WL0}=c_0$, $V_{WL1}=c_1$, $V_{WL2 \sim n-1}=0$, $V_{BL0}=\overline{s_0^*}$, $V_{BL1}=\overline{s_1^*}$, $V_{BL2 \sim n-1}=0$, $V_{SL0}=s_0^*$, $V_{SL1}=s_1^*$ and $V_{SL2 \sim n-1}=0$ to calculate $s_0=a_0 \oplus b_0 \oplus c_0$ and $s_1=a_1 \oplus b_1 \oplus c_1$, and store $s_0$ in $R_0$ of the 1T1R array $D_3$ and $s_1$ in $R_1$ of the 1T1R array $D_3$.

(S2-4) Denoting the i-th bit in the operation data or operation result by i, and giving i an initial value of i=2.

(S2-5) Inputting logic signals $V_{WLn}=1$, $V_{BLn}=a_{i-1}$ and $V_{SLn}=\overline{b_{i-1}}$ to calculate $c_i=a_{i-1} \cdot b_{i-1} + a_{i-1} \cdot c_{i-1} + c_{i-1} \cdot b_{i-1}$ and store $c_i$ in $R_n$ of the 1T1R array $D_2$.

(S2-6) Reading $s_i^*$ from $R_{ib}$ of the 1T1R array $D_1$; inputting logic signals $V_{WL0 \sim (i-1)}=0$, $V_{WLi}=c_i$, $V_{WL(i+1) \sim (n-1)}=0$, $V_{BL0 \sim (i-1)}=0$, $V_{BLi}=\overline{s_i^*}$, $V_{BL(i+1) \sim (n-1)}=0$, $V_{SL0 \sim (i-1)}=0$, $V_{SLi}=s_i^*$ and $V_{SL(i+1) \sim (n-1)}=0$ to calculate $s_i=a_i \oplus b_i \oplus c_i$ and store $s_i$ in $R_i$ of the 1T1R array $D_3$.

(S2-7) Incrementing the value of i by 1, and if i<n−1, proceeding to the step (S2-5); otherwise, proceeding to step (S2-8).

(S2-8) Inputting logic signals $V_{WLn}=1$, $V_{BLn}=a_{n-2}$ and $V_{SLn}=\overline{b_{n-2}}$ to calculate $c_{n-1}=a_{n-2} \cdot b_{n-2} + a_{n-2} \cdot c_{n-2} + c_{n-2} \cdot b_{n-2}$ and store $c_{n-1}$ in $R_n$ of the 1T1R array $D_2$.

(S2-9) Reading $s_{(n-1)}^*$ from $R_{(n-1)b}$ of the 1T1R array $D_1$; inputting logic signals $V_{WL0 \sim (n-2)}=0$, $V_{WL(n-1)}=c_{n-1}$, $V_{BL0 \sim (n-2)}=0$, $V_{BL(n-1)}=\overline{s_{n-1}^*}$, $V_{SL0 \sim (n-2)}=0$ and $V_{SL(n-1)}=s_{n-1}^*$ to calculate $s_{n-1}=a_{n-1} \oplus b_{n-1} \oplus c_{n-1}$ and store $s_{n-1}$ in $R_{n-1}$ of the 1T1R array $D_3$.

(S2-10) inputting logic signals $V_{WLn}=1$, $V_{BLn}=a_{n-1}$ and $V_{SLn}=\overline{b_{n-1}}$ to calculate $c_n=a_{n-1}\cdot b_{n-1}+a_{n-1}\cdot c_{n-1}+c_{n-1}\cdot b_{n-1}$ and store $c_n$ in $R_n$ of the 1T1R array $D_2$.

According to a fourth aspect of the present invention, there is provided an operation circuit based on the computing array for implementing an optimized multi-bit step-by-step carry adder, in which sums $s_{0\sim n-1}$ and carry information $c_n$ are calculated according to input data $a_{0\sim n-1}$ and $b_{0\sim n-1}$ and carry information $c_0$, and n represents the number of bits of the operation data; the operation circuit comprises: a 1T1R array $E_1$, a 1T1R array $E_2$ and a 1T1R array $E_3$; the 1T1R array $E_1$ includes n 1T1R devices $R_{0b}\sim R_{(n-1)b}$ for calculating and storing data $s_{0\sim n-1}$*, word line control signals corresponding to $R_{0b}\sim R_{(n-1)b}$ are respectively $V_{WL0b}\sim V_{WL(n-1)b}$, bit line control signals corresponding to $R_{0b}\sim R_{(n-1)b}$ are respectively $V_{BL0b}\sim V_{BL(n-1)b}$, and source line control signals corresponding to $R_{0b}\sim R_{(n-1)b}$ are respectively $V_{SL0b}\sim V_{SL(n-1)b}$; the 1T1R array $E_1$ is used for data backup; the 1T1R array $E_2$ includes (n+1) 1T1R devices $R_{0c}\sim R_{nc}$ for calculating and storing carry data $c_i$ (i is an integer from 0 to n), word line control signals corresponding to $R_{0c}\sim R_{nc}$ are respectively $V_{WL0c}\sim V_{WLnc}$, bit line control signals corresponding to $R_{0c}\sim R_{nc}$ are respectively $V_{BL0c}\sim V_{BLnc}$, and source line control signals corresponding to $R_{0c}\sim R_{nc}$ are respectively $V_{SL0c}\sim V_{SLnc}$; the 1T1R array $E_3$ includes n 1T1R devices $R_0\sim R_{n-1}$ for calculating and storing addition operation results $s_{0\sim n-1}$, word line control signals corresponding to $R_0\sim R_{n-1}$ are respectively $V_{WL0}\sim V_{WL(n-1)}$, bit line control signals corresponding to $R_0\sim R_{n-1}$ are respectively $V_{BL0}\sim V_{BL(n-1)}$, and source line control signals corresponding to $R_0\sim R_{n-1}$ are respectively $V_{SL0}\sim V_{SL(n-1)}$; and the intermediate data $s_{0\sim n-1}$* calculated by the 1T1R array $E_1$ and the carry information $c_i$ calculated by the 1T1R array $E_2$ are converted by the signal amplifier and the control signal modem, and then transmitted to the 1T1R array $E_3$ through the data transmission circuit.

In conjunction with the fourth aspect of the present invention, the present invention further provides an operating method based on the operation circuit, which comprises:

(S3-1) Inputting logic signals $V_{WL0\sim(n-1)}=1$, $V_{BL0\sim(n-1)}=a_{0\sim n-1}$ and $V_{SL0\sim(n-1)}=\overline{a_{0\sim n-1}}$ to write the input operational data $a_{0\sim n-1}$ into $R_{0\sim n-1}$ of the 1T1R array $E_3$; inputting logic signals $V_{WL0b\sim(n-1)b}=1$, $V_{BL0b\sim(n-1)b}=a_{0\sim n-1}$ and $V_{SL0b\sim(n-1)b}=\overline{a_{0\sim n-1}}$ to write the input operational data $a_{0\sim n-1}$ into $R_{0b\sim(n-1)b}$ of the 1T1R array $E_1$; inputting logic signals $V_{WL0c\sim nc}=1$, $V_{BL0c\sim nc}=c_0$ and $V_{SL0c\sim nc}=\overline{c_0}$ to write the carry information $c_0$ into $R_{0c\sim nc}$ of the 1T1R array $E_2$.

(S3-2) Inputting logic signals $V_{WL0\sim(n-1)}=b_{0\sim n-1}$, $V_{BL0\sim(n-1)}=\overline{a_{0\sim n-1}}$ and $V_{SL0\sim(n-1)}=a_{0\sim n-1}$ to calculate intermediate results $s_{0\sim n-1}*=a_{0\sim n-1}\oplus b_{0\sim n-1}$ and store $s_{0\sim n-1}$* in $R_{0\sim n-1}$ of the 1T1R array $E_3$; inputting logic signals $V_{WL0b\sim(n-1)b}=b_{0\sim n-1}$, $V_{BL0b\sim(n-1)b}=\overline{a_{0\sim n-1}}$ and $V_{SL0b\sim(n-1)b}=a_{0\sim n-1}$ to calculate intermediate results $s_{0\sim n-1}$* and store $s_{0\sim n-1}$* in $R_{0b\sim(n-1)b}$ of the 1T1R array $E_1$; inputting logic signals $V_{WL0c}=0$, $V_{WL1c\sim nc}=1$, $V_{BL0c\sim nc}=a_0$ and $V_{SL0c\sim nc}=\overline{b_0}$ to calculate $c_1=a_0\cdot b_0+a_0\cdot c_0+c_0\cdot b_0$ and store $c_1$ in $R_{1c\sim nc}$ of the 1T1R array $E_2$.

(S3-3) Reading $s_0$* from $R_{0b}$ of the 1T1R array $E_1$, and reading $s_1$* from $R_{1b}$ of the 1T1R array E1; inputting logic signals $V_{WL0}=c_0$, $V_{WL1}=c_1$, $V_{WL2\sim(n-1)}=0$, $V_{BL0}=\overline{s_0*}$, $V_{BL1}=\overline{s_1*}$, $V_{BL2\sim(n-1)}=0$, $V_{SL0}=s_0$*, $V_{SL1}=s_1$* and $V_{SL2\sim(n-1)}=0$ to calculate $s_0=a_0\oplus b_0\oplus c_0$ and $s_1=a_1\oplus b_1\oplus c_1$, and store $s_0$ in $R_0$ of the 1T1R array $E_3$ and $s_1$ in $R_1$ of the 1T1R array $E_3$; inputting logic signals $V_{WL0c\sim 1c}=0$, $V_{WL2\sim nc}=1$, $V_{BL0\sim nc}=a_1$ and $V_{SL0c\sim nc}=\overline{b_1}$ to calculate $c_2=a_1\cdot b_1+a_1\cdot c_1+c_1\cdot b_1$ and store $c_2$ in $R_{2c\sim nc}$ of the 1T1R array $E_2$.

(S3-4) Denoting the i-th bit in the operation data or operation result by i, and giving i an initial value of i=2.

(S3-5) Reading $s_i$* from $R_{ib}$ of the 1T1R array $E_1$; inputting logic signals $V_{WL0\sim(i-1)}=0$, $V_{WLi}=c_i$, $V_{WL(i+1)\sim(n-1)}=0$, $V_{BL0\sim(i-1)}=0$, $V_{BLi}=\overline{s_i*}$, $V_{BL(i+1)\sim(n-1)}=0$, $V_{SL0\sim(i-1)}=0$, $V_{SLi}=s_i$* and $V_{SL(i+1)\sim(n-1)}=0$ to calculate $s_i=a_i\oplus b_i\oplus c_i$, and store $s_i$ in $R_i$ of the 1T1R array $E_3$; inputting logic signals $V_{WL0c\sim ic}=0$, $V_{WL(i+1)c\sim nc}=1$, $V_{BL0c\sim nc}=a_i$ and $V_{SL0c\sim nc}=\overline{b_i}$ to calculate $c_{i+1}=a_i\cdot b_i+a_i\cdot c_i+c_i\cdot b_i$ and store $c_{i+1}$ in $R_{(i+1)c\sim nc}$ of the 1T1R array $E_2$.

(S3-6) Incrementing the value of i by 1, and if i<n−1, proceeding to the step (S3-5); otherwise, proceeding to a step (S3-7).

(3-7) Reading $s_{n-1}$* from $R_{(n-1)b}$ the 1T1R array $E_1$; inputting logic signals $V_{WL0\sim(n-2)}=0$, $V_{WL(n-1)}=c_{n-1}$, $V_{BL0\sim(n-2)}=0$, $V_{BL(n-1)}=\overline{s_{n-1}*}$, $V_{SL0\sim(n-2)}=0$ and $V_{SL(n-1)}=s_{n-1}$* to calculate $s_{n-1}=a_{n-1}\oplus b_{n-1}\oplus c_{n-1}$ and store $s_{n-1}$ in $R_{n-1}$ of the 1T1R array $E_3$; and inputting logic signals $V_{WL0c\sim(n-1)c}=0$, $V_{WLnc}=1$, $Y_{BL0c\sim nc}=a_{n-1}$ and $V_{SL0c\sim nc}=\overline{b_{n-i}}$ to calculate $c_n=a_{n-1}\cdot b_{n-1}+a_{n-1}\cdot c_{n-1}+c_{n-1}\cdot b_{n-1}$ and store $c_n$ in $R_{nc}$ of the 1T1R array $E_2$.

According to a fifth aspect of the present invention, there is provided an operation circuit based on the computing array for implementing a 2-bit data selector, in which a logic signal a, a logic signal b and a control signal Sel are input to output the logic signal a or the logic signal b by controlling a value of the control signal Sel; the operation circuit comprises: a 1T1R array F, wherein the 1T1R array F includes one 1T1R device R, a word line signal corresponding to R is $V_{WL}$, a bit line signal corresponding to R is $V_{BL}$, and a source line signal corresponding to R is $V_{SL}$.

In conjunction with the fifth aspect of the present invention, the present invention further provides an operating method based on the operation circuit, which comprises:

(S4-1) Inputting logic signals $V_{WL}=1$, $V_{BL}=a$ and $V_{SL}=\overline{a}$ to initialize the 1T1R device R, and write the input logic signal an into R of the 1T1R array F.

(S4-2) Inputting logic signals $V_{WL}=$Sel, $V_{BL}=b$ and $V_{SL}=\overline{b}$ to input the logic signal b and the control signal Sel so as to select an output logic signal out, wherein the logic signal a and the logic signal b represent only two independent logic signals; when the control signal Sel=0, the output signal out=a; and when the control signal Sel=1, the output signal out=b.

According to a sixth aspect of the present invention, there is provided an operation circuit based on the computing array for implementing a multi-bit carry select adder, in which sums $s_{0\sim n-1}$ and carry information $c_n$ are calculated according to input data $a_{0\sim n-1}$ and $b_{0\sim n-1}$ and carry information $c_0$, n represents the number of bits of the operation data, and in the calculation process, according to the carry information of each bit, an XNOR operation result or an XOR operation result of the corresponding bit of the operation data is selected as bit information of the sum; the operation circuit comprises: a 1T1R array $G_1$, a 1T1R array $G_2$ and a 1T1R array $G_3$; the 1T1R array $G_1$ includes n 1T1R devices $R_{0x}\sim R_{(n-1)x}$ for calculating and storing XNOR operation results of data $a_{0\sim n-1}$ and $b_{0\sim n-1}$ ($X_{0\sim n-1}=a_{0\sim n-1}$ XNOR $b_{0\sim n-1}$), word line control signals corresponding to $R_{0x}\sim R_{(n-1)x}$ are respectively $V_{WL0x}\sim V_{WL(n-1)x}$, bit line control signals corresponding to $R_{0x}\sim R_{(n-1)x}$ are respectively $V_{BL0x}\sim V_{BL(n-1)x}$, and source line control signals corresponding to $R_{0x}\sim R_{(n-1)x}$ are respectively $V_{SL0x}\sim V_{SL(n-1)x}$; the 1T1R array $G_2$ includes (n+1) 1T1R devices $R_{0c}\sim R_{nc}$ for calculating carry data $c_i$ (i is an integer from 0 to n), word line control signals corresponding to $R_{0c}\sim R_{nc}$ are respectively $V_{WL0x}\sim V_{WLnc}$, bit line control signals corresponding to $R_{0c} \sim R_{nc}$ are respectively $V_{BL0c} \sim V_{BLnc}$, and source line control signals corresponding to $R_{0c} \sim R_{nc}$ are respectively $V_{SL0c} \sim V_{SLnc}$; the 1T1R array $G_3$ includes n 1T1R devices $R_0 \sim R_{n-1}$ for calculating and storing addition operation results $s_{0 \sim n-1}$, word line control signals corresponding to $R_0 \sim R_{n-1}$ are respectively $V_{WL0} \sim V_{WL(n-1)}$, bit line control signals corresponding to $R_0 \sim R_{n-1}$ are respectively $V_{BL0}$-$V_{BL(n-1)}$, and source line control signals corresponding to $R_0 \sim R_{n-1}$ are respectively $V_{SL0}$-$V_{SL(n-1)}$; and the XNOR operation results $X_{0 \sim n-1}$ calculated by the 1T1R array $G_1$ and the carry information $c_i$ calculated by the 1T1R array $G_2$ are converted by the signal amplifier and the control signal modem, and then transmitted to the 1T1R array $G_3$ through the data transmission circuit.

In conjunction with the sixth aspect of the present invention, the present invention further provides an operating method based on the operation circuit, which comprises:

(S5-1) Inputting logic signals $V_{WL0x \sim (n-1)x}=1$, $V_{BL0x \sim (n-1)x}=\overline{b_{0 \sim n-1}}$ and $V_{SL0x \sim (n-1)x}=b_{0 \sim n-1}$ to store the result $\overline{b_{0 \sim n-1}}$ of inverting the input operation data $b_{0 \sim n-1}$ in $R_{0x \sim nc}=\overline{c_0}$ of the 1T1R array G1; inputting logic signals $V_{WL0c \sim nc}=1$, $V_{BL0c \sim nc}=c_0$ and $V_{SL0c \sim nc}=\overline{c_0}$ to store $c_0$ in $R_{0c \sim nc}$ of the 1T1R array $G_2$; inputting logic signals $V_{WL0 \sim (n-1)}=1$, $V_{BL0 \sim (n-1)}=a_{0 \sim n-1}$ and $V_{SL0 \sim (n-1)}=\overline{a_{0 \sim n-1}}$ to store the input operational data $a_{0 \sim n-1}$ in $R_{0 \sim n-1}$ of the 1T1R array $G_3$.

(S5-2) Inputting logic signals $V_{WL0x \sim (n-1)x}=a_{0 \sim n-1}$, $V_{BL0x \sim (n-1)x}=b_{0 \sim n-1}$ and $V_{SL0x \sim (n-1)x}=\overline{b_{0 \sim n-1}}$ to calculate XNOR operation results of the calculated data $a_{0 \sim n-1}$ and $b_{0 \sim n-1}$ ($X_{0 \sim n-1}=a_{0 \sim n-1}$ XNOR $b_{0 \sim n-1}$) and store $X_{0 \sim n-1}$ in $R_{0x \sim (n-1)x}$ of the 1T1R array $G_1$; inputting logic signals $V_{WL0c}=0$, $V_{WL1c \sim nc}=1$, $V_{BL0c \sim nc}=a_0$ and $V_{SL0c \sim nc}=\overline{b_0}$ to calculate $c_1=a_0 \cdot b_0+a_0 \cdot c_0+c_0 \cdot b_0$ and store $c_1$ in $R_{1c \sim nc}$ of the 1T1R array $G_2$; inputting logic signals $V_{WL0x \sim (n-1)}=b_{0 \sim n-1}$, $V_{BL0x \sim (n-1)}=a_{0 \sim n-1}$ and $V_{SL0x \sim (n-1)}=\overline{a_{0 \sim n-1}}$, to calculate XOR operation results $s_{0 \sim n-1}^*=a_{0 \sim n-1} \oplus b_{0 \sim n-1}$ and store $s_{0 \sim n-1}^*$ in $R_{0 \sim n-1}$ of the 1T1R array $G_3$.

(S5-3) Inputting logic signals $V_{WL0c \sim 1c}=0$, $V_{WL2c \sim nc}=1$, $V_{BL0c \sim nc}=a_1$ and $V_{SL0c \sim nc}=\overline{b_1}$ to calculate $c_2=a_1 \cdot b_1+a_1 \cdot c_1+c_1 \cdot b_1$ and store $c_2$ in $R_{2c \sim nc}$ of the 1T1R array $G_2$; inputting logic signals $V_{WL0}=c_0$, $\overline{V_{WL1}}=c_1$, $V_{WL2 \sim (n-1)}=0$, $V_{BL0 \sim (n-1)}=X_{0 \sim n-1}$ and $V_{SL0 \sim (n-1)}=\overline{X_{0 \sim n-1}}$ to calculate $s_0$ and $s_1$, and store $s_0$ in $R_0$ of the 1T1R array $G_3$ and $s_1$ in $R_1$ of the 1T1R array $G_3$; when $c_0=0$, $s_0=a_0 \oplus b_0$, and when $c_1=0$, $s_0=\overline{a_0 \oplus b_0}$; when $c_1=0$, $s_1=a_1 \oplus b_1$, and when $c_1=1$, $s_1=\overline{a_1 \oplus b_1}$.

(S5-4) Denoting the i-th bit in the operation data or operation result by i, and giving i an initial value of i=2.

(S5-5) Inputting logic signals $V_{WL0c \sim ic}=0$, $V_{WL(i+1)c \sim nc}=1$, $V_{BL0c \sim nc}=a_i$ and $V_{SL0c \sim nc}=\overline{b_i}$ to calculate $c_{i+1}=a_i \cdot b_i+a_i \cdot c_i+c_i \cdot b_i$ and store $c_{i+1}$ in $R_{(i+1)c \sim nc}$ of the 1T1R array $G_2$; inputting logic signals $V_{WL0x \sim (i-1)}=0$, $V_{WLi}=c_i$, $V_{WL(i+1) \sim (n-1)}=0$, $V_{BL0 \sim (n-1)}=X_{0 \sim n-1}$ and $V_{SL0 \sim (n-1)}=\overline{X_{0 \sim n-1}}$ to calculate $s_i$ and store $s_i$ in $R_i$ of the 1T1R array $G_3$; when $c_i=0$, $s_i=a_i \oplus b_i$, and when $c_i=1$, $s_i=\overline{a_i \oplus b_i}$.

(S5-6) Incrementing the value of i by 1, and if i<n−1, proceeding to the step (S5-5); otherwise, proceeding to a step (S5-7).

(S5-7) Inputting logic signals $V_{WL0c \sim (n-1)c}=0$, $V_{WLnc}=1$, $V_{BL0c \sim nc}=a_{n-1}$ and $V_{SL0c \sim nc}=\overline{b_{n-1}}$ to calculate $c_n=a_{n-1} \cdot b_{n-1}+a_{n-1} \cdot c_{n-1}+c_{n-1} \cdot b_{n-1}$ and store $c_n$ in $R_{nc}$ of the 1T1R array $G_2$; inputting logic signals $V_{WL0 \sim (n-2)}=0$, $V_{WL(n-1)}=c_{n-1}$, $V_{BL0 \sim (n-1)}=X_{0 \sim n-1}$ and $V_{SL0 \sim (n-1)}=\overline{X_{0 \sim n-1}}$ to calculate $s_{n-1}$ and store $s_{n-1}$ in $R_{n-1}$ of the 1T1R array $G_3$; when $n_{n-1}=0$, $s_{n-1}=a_{n-1} \oplus b_{n-1}$, and when $c_{n-1}=1$, $s_7=\overline{a_{n-1} \oplus b_{n-1}}$.

According to a seventh aspect of the present invention, there is provided an operation circuit based on the computing array for implementing a multi-bit pre-calculation adder, in which sums $s_{0 \sim n-1}$ and carry information $c_n$ are calculated according to input data $a_{0 \sim n-1}$ and $b_{\sim n-1}$ and carry information $c_0$, and n represents the number of bits of the operation data; the operation circuit comprises: a 1T1R array $H_1$ and a 1T1R array Hz; the 1T1R array $H_1$ includes (n+1) 1T1R devices $R_{0c} \sim R_{nc}$ for calculating carry data $c_i$ (i is an integer from 0 to n), word line control signals corresponding to $R_{0c} \sim R_{nc}$ are respectively $V_{WL0c} \sim V_{WLnc}$, bit line control signals corresponding to $R_{0c} \sim R_{nc}$ are respectively $V_{BL0c} \sim V_{BLnc}$, and source line control signals corresponding to $R_{0c} \sim R_{nc}$ are respectively $V_{SL0c} \sim V_{SLnc}$; the 1T1R array $H_2$ includes n 1T1R devices $R_0 \sim R_{n-1}$ for calculating and storing addition operation results $s_{0 \sim n-1}$, word line control signals corresponding to $R_0 \sim R_{n-1}$ are respectively $V_{WL0} \sim V_{WL(n-1)}$, bit line control signals corresponding to $R_0 \sim R_{n-1}$ are respectively $V_{BL0} \sim V_{BL(n-1)}$, and source line control signals corresponding to $R_0 \sim R_{n-1}$ are respectively $V_{SL0} \sim V_{SL(n-1)}$; and the carry information $c_i$ calculated by the 1T1R array $H_1$ is converted by the signal amplifier and the control signal modem, and then transmitted to the 1T1R array $H_2$ through the data transmission circuit.

In conjunction with the seventh aspect of the present invention, the present invention further provides an operating method based on the operation circuit, which comprises:

(S6-1) Inputting logic signals $V_{WL0c \sim nc}=1$, $V_{BL0c \sim nc}=c_0$ and $V_{SL0c \sim nc}=\overline{c_0}$ to store $c_0$ in $R_{0c \sim nc}$ of the 1T1R array $H_1$; inputting logic signals $V_{WL0 \sim (n-1)}=1$, $V_{BL0 \sim (n-1)}=c_0$ and $V_{SL0 \sim (n-1)}=\overline{c_0}$ to store the input carry information $c_0$ in $R_{0 \sim n-1}$ of the 1T1R array $H_2$.

(S6-2) Inputting logic signals $V_{WL0c}=0$, $V_{WL1c \sim nc}=1$, $V_{BL0c \sim nc}=a_0$ and $V_{SL0c \sim nc}=\overline{b_0}$ to calculate $c_1=a_0 \cdot b_0+a_0 \cdot c_0+c_0 \cdot b_0$ and store $c_1$ in $R_{1c \sim nc}$ of the 1T1R array $H_1$; inputting logic signals $V_{WL0 \sim (n-1)}=1$, $V_{BL0 \sim (n-1)}=a_0$, $V_{SL0}=b_0$ and $V_{SL1 \sim (n-1)}=\overline{b_0}$ to calculate $s_0'=c_0 \cdot a_0+\overline{c_0} \cdot a_0 \cdot \overline{b_0}+c_0 \cdot \overline{a_0} \cdot b_0$ and $c_1=a_0 \cdot b_0+a_0 \cdot c_0+c_0 \cdot b_0$, and store $s_0'$ in $R_0$ of the 1T1R array $H_2$ and $c_1$ in $R_{1 \sim n-1}$ of the 1T1R array $H_2$.

(S6-3) Inputting logic signals $V_{WL0c \sim 1c}=0$, $V_{WL2c \sim nc}=1$, $V_{BL0c \sim nc}=a_1$ and $V_{SL0c \sim nc}=\overline{b_1}$, to calculate $c_2=a_1 \cdot b_1+a_1 \cdot c_1+c_1 \cdot b_1$ and store $c_2$ in $R_{2c \sim nc}$ of the 1T1R array $H_1$; inputting logic signals $V_{WL0 \sim (n-1)}=1$, $V_{BL0}=b_0$, $V_{BL1 \sim (n-1)}=a_1$, $V_{SL0}=c_1$, $V_{SL1}=b_1$ and $V_{SL2 \sim (n-1)}=\overline{b_1}$ to calculate $s_0=a_0 \oplus b_0 \oplus c_0$, $s_1=c_1 \cdot a_1+\overline{c_1} \cdot a_1 \cdot \overline{b_1}+c_1 \overline{a_1} \cdot \overline{b_1}$ and $c_2=a_1 \cdot b_1+a_1 \cdot c_1+c_1 \cdot b_1$, and store $s_0$ in $R_0$ of the 1T1R array $H_2$, $s_1$ in $R_1$ of the 1T1R array $H_2$ and $c_2$ in $R_{2 \sim (n-1)}$ of the 1T1R array $H_2$.

(S6-4) Denoting the i-th bit in the operation data or operation result by i, and giving i an initial value of i=1.

(S6-5) Inputting logic signals $V_{WL0c \sim (i+1)c}=0$, $V_{WL(i+2)c \sim nc}=1$, $V_{BL0c \sim nc}=a_{i+1}$ and $V_{SL0c \sim nc}=\overline{b_{i+1}}$ to calculate $c_{i+2}=a_{i+1} \cdot b_{i+1}+a_{i+1} \cdot c_{i+1}+c_{i+1} \cdot b_{i+1}$ and store $c_{i+2}$ in $R_{(i+2)c \sim nc}$ of the 1T1R array $H_1$; inputting logic signals $V_{WL0 \sim (i-1)}=0$, $V_{WLi \sim (n-1)}=1$, $V_{BL0 \sim (i-1)}=0$, $V_{BLi}=b_i$, $V_{BL(i+1) \sim (n-1)}=a_{i+1}$, $V_{SL0 \sim (i-1)}=0$, $V_{SLi}=c_{i+1}$, $V_{SL(i+1)}=b_{(i+1)}$ and $V_{SL(i+2) \sim (n-1)}=\overline{b_{i+1}}$ to calculate $s_i=a_i \oplus b_i \oplus c_i$, $s_{i+1}=c_{i+1} \cdot a_{i+1}+\overline{c_{i+1}} \cdot a_{i+1} \overline{b_{i+1}}+c_{i+1} \cdot \overline{a_{i+1}} \cdot \overline{bc_{i+1}}$, and $c_{i+2}=a_{i+1} \cdot b_{i+1}+a_{i+1} \cdot c_{i+1}+c_{i+1} \cdot b_{i+1}$ and store $s_i$ in $R_1$ of the 1T1R array $H_2$, $s_{i+1}$ in $R_{i+1}$ of the 1T1R array $H_2$ and $c_{i+2}$ in $R_{(i+2) \sim (n-1)}$ of the 1T1R array $H_2$.

(S6-6) Incrementing the value of i by 1, and if i<n−1, proceeding to the step (S6-5); otherwise, proceeding to a step (S6-7).

(S6-7) Inputting logic signals $V_{WL0c \sim (n-1)c}=0$, $V_{WLnc}=1$, $V_{BL0c \sim nc}=a_{n-1}$ and $V_{SL0c \sim nc}=\overline{b_{n-1}}$ to calculate $c_n=a_{n-1} \cdot b_{n-1}+a_{n-1} \cdot c_{n-1}+c_{n-1} \cdot b_{n-1}$ and store $c_n$ in $R_{nc}$ of the 1T1R array $H_1$; inputting logic signals $V_{WL0 \sim (n-3)}=0$, $V_{WL(n-2) \sim (n-1)}=1$, $V_{BL0 \sim (n-3)}=0$, $V_{BL(n-2)}=b_{n-2}$, $V_{BL(n-1)}=a_{n-1}$, $V_{SL0 \sim (n-3)}=0$, $V_{SL(n-2)}=c_{n-1}$ and $V_{SL(n-1)}=\overline{b_{n-1}}$ to calculate $s_{n-2}=a_{n-2} \oplus b_{n-2} \oplus c_{n-2}$ and $s_{n-1}=c_{n-1} \cdot a_{n-1}+\overline{c_{n-1}} \cdot a_{n-1} \cdot \overline{b_{n-1}}+c_{n-1} \cdot \overline{a_{n-1}} \cdot b_{n-1}$ and store $s_{n-2}$ in $R_{n-2}$ of the 1T1R array $H_2$ and $s_{n-1}$ in $R_{n-1}$ of the 1T1R array $H_2$.

(S6-8) Inputting logic signals $V_{WL0\sim(n-2)}=0$, $V_{WL(n-1)}=1$, $V_{BL0\sim(n-2)}=0$, $V_{BL(n-1)}=b_{n-1}$, $V_{SL0\sim(n-2)}=0$ and $V_{SL(n-1)}=c_n$ to calculate $s_{n-1}=a_{n-1}\oplus b_{n-1}\oplus c_{n-1}$ and store $s_{n-1}$ in $R_{n-1}$ of the 1T1R array $H_2$.

In general, with the above technical solution conceived by the present invention, a computing array based on 1T1R device is provided, and based on the computing array according to the present invention, multiple operation circuits are provided, which can achieve the following beneficial effects.

(1) The operation circuits are based on the computing array based on 1T1R device, and can directly store the calculated result in the 1T1R devices of the computing array while performing the logic operation, thereby achieving the fusion of computing and storage.

(2) The operation circuits according to the present invention can complete all logical operations in two steps when implementing 16 kinds of Boolean logic operations, greatly simplifying the design of the logic circuit and reducing the complexity of the integration process.

(3) By setting a different number of 1T1R arrays in the computing array and a different number of 1T1R devices in the 1T1R array in combination with the corresponding operating methods, in addition to 16 basic Boolean logic operations, complex operations such as a 1-bit full adder, a multi-bit step-by-step carry adder and optimization design thereof, a 2-bit data selector, a multi-bit carry select adder and a multi-bit pre-calculation adder can be realized.

Figure 1:
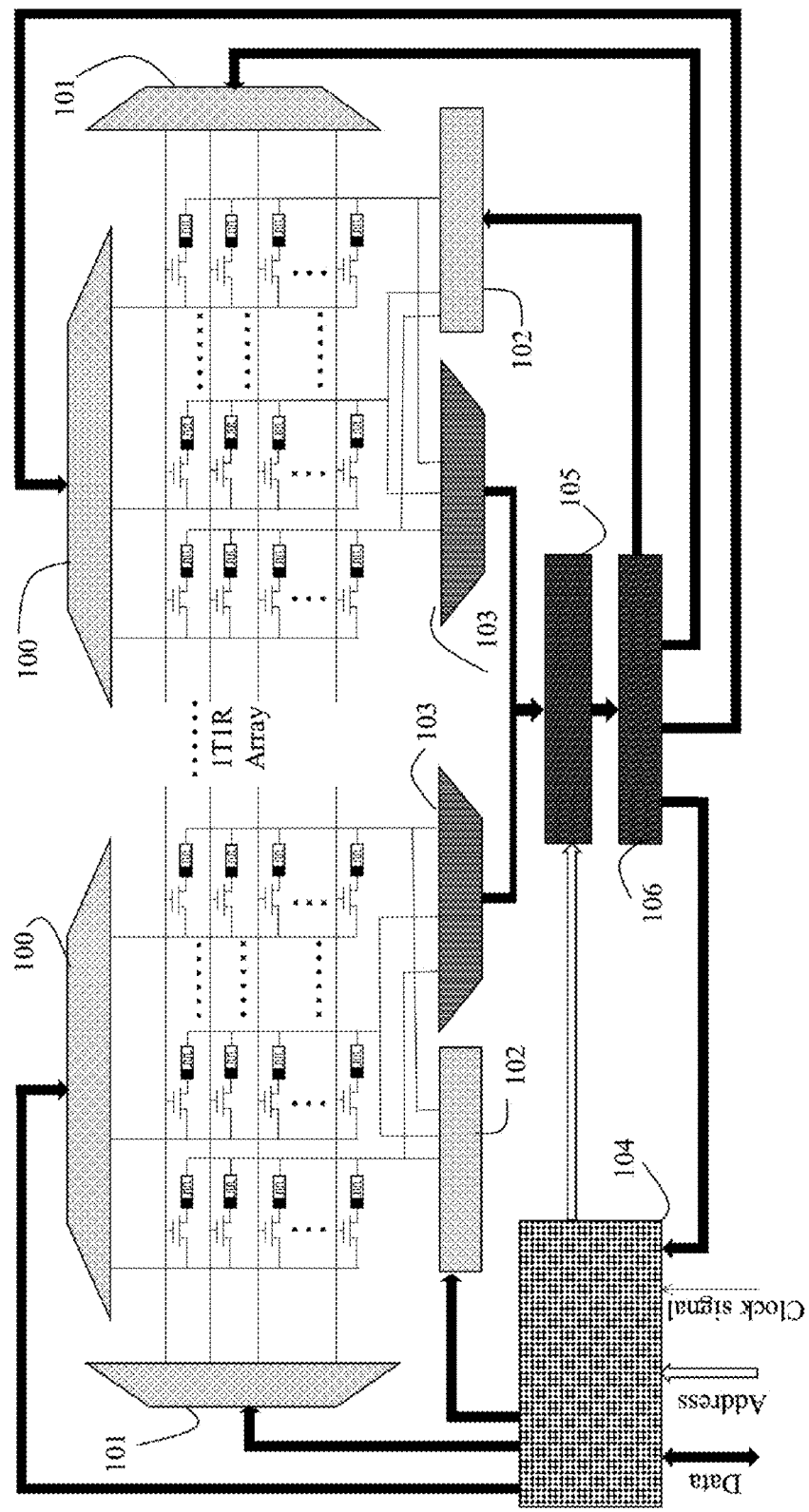
FIG. 1 is a schematic diagram of a computing array based on 1T1R device according to an embodiment of the present invention.

In all figures, the same elements or structures are denoted by the same reference numerals, in which:
100: source line decoder, 101: word line decoder, 102: bit line decoder, 103: signal amplifier, 104: state controller, 105: control signal modem, 106: data transmission circuit, 300: bit Line, 301: upper electrode of RRAM, 302: functional layer of RRAM, 303: lower electrode of RRAM, 304: source line, 305: gate of transistor, 306: insulating layer of transistor, 307: source of transistor, 308: drain of transistor, and 309: substrate of transistor.

DETAILED DESCRIPTION OF THE EMBODIMENTS

For clear understanding of the objectives, features and advantages of the present invention, detailed description of the present invention will be given below in conjunction with accompanying drawings and specific embodiments. It should be noted that the embodiments described herein are only meant to explain the present invention, and not to limit the scope of the present invention. Furthermore, the technical features related to the embodiments of the invention described below can be mutually combined if they are not found to be mutually exclusive.

A computing array based on 1T1R device according to the present invention, as shown in FIG. 1, includes: one or more 1T1R arrays and a peripheral circuit; the 1T1R array is configured to achieve operation and storage of an operation result, and the peripheral circuit is configured to transmit data and control signals to control operation and storage processes of the 1T1R array.

Figure 2:
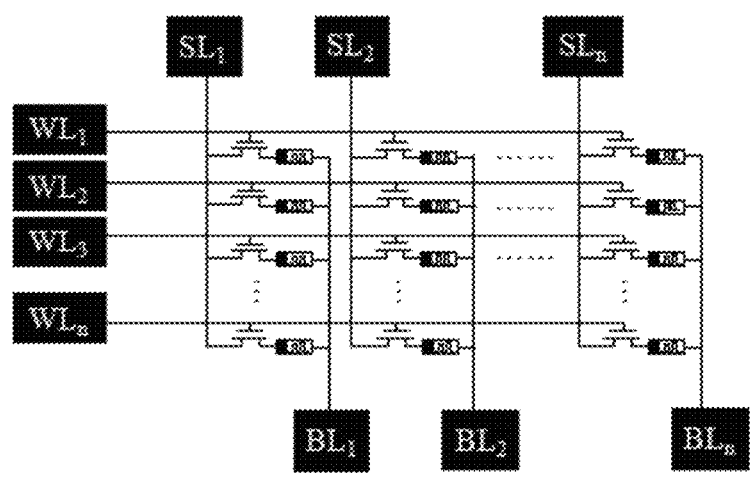
FIG. 2 is a schematic diagram of a 1T1R array in the computing array according to the embodiment of the present invention.

The 1T1R array, as shown in FIG. 2, includes 1T1R devices arranged in an array, word lines WL, bit lines BL and source lines SL; the 1T1R devices realize storage and processing of information through different resistance states; the 1T1R devices in the same row are connected to the same word line, and the 1T1R devices in the same column are connected to the same bit line and source line; and through applying different signals to the word lines WL, bit lines BL and source lines SL, different operations are achieved and operation results are stored.

Figure 3:
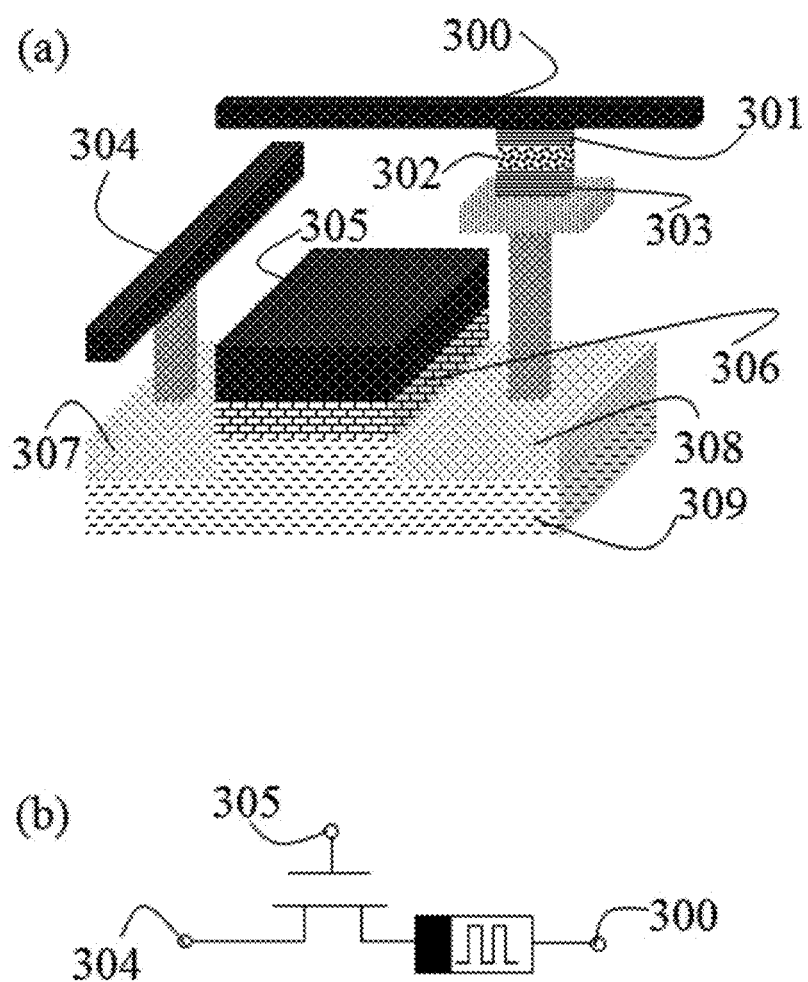
FIG. 3 is a schematic diagram of a three-dimensional structure and an equivalent circuit diagram of the 1T1R device according to the embodiment of the present invention, in which (a) is a schematic diagram of a three-dimensional structure of the 1T1R device; and (b) is an equivalent circuit diagram of a 1T1R device.

The 1T1R device, as shown in FIG. 3, includes a transistor and a resistive element. The transistor includes a substrate 309, a source 307, a drain 308, an insulating layer 306 and a gate 305. In this embodiment, the resistive element is a resistive random access memory (RRAM), which includes: an upper electrode 301, a functional layer 302 and a lower electrode 303. The source 307 of the transistor is connected to the source line 304, the gate 305 of the transistor is connected to the word line, the upper electrode 301 of RRAM is connected to the bit line 300, and the lower electrode 303 of RRAM is connected to the drain 308 of the transistor.

The resistance states of the 1T1R devices include: High Resistance H and Low Resistance L. The resistance state of the 1T1R device can be reversibly transformed under the stimulation of an applied signal, namely, with the stimulation of an applied signal, the resistance state of the 1T1R device can be transformed from High Resistance to Low Resistance, and with the stimulation of another applied signal, the resistance state of the 1T1R device can be transformed from Low Resistance to High Resistance. By using the two resistance states of the 1T1R device, storage and processing of information can be achieved.

As shown in FIG. 1, the peripheral circuit includes a state controller 104, a word line decoder 101, a source line decoder 100, a bit line decoder 102, a signal amplifier 103, a control signal modem 105 and a data transmission circuit 106, in which:

The state controller 104 has a data input/output terminal Data, an address input terminal Address, a clock signal input terminal CLK, a result input terminal, a word line output terminal, a bit line output terminal, a source line output terminal and a secondary output terminal; the data input/output terminal Data of the state controller is configured to input calculated data on the one hand and output a calculated result on the other hand, the address input terminal Address of the state controller is configured to input address information of a selected device, the clock signal input terminal CLK of the state controller is configured to input a clock signal for controlling a calculation timing, and the result input terminal is configured to input a calculated result generated by a pre-stage circuit; the state controller generates a control signal according to the input data, address information, clock signal and calculated result, or outputs a final calculated result.

An input terminal of the word line decoder 101 is connected to the word line output terminal of the state controller 104, an output terminal of the word line decoder 101 is connected to the word line of the 1T1R array; the word line decoder 101 decodes the control signal generated by the state controller 104 to obtain a word line control signal, and inputs the word line control signal to the 1T1R devices through the word line of the 1T1R array.

An input terminal of the bit line decoder 102 is connected to the bit line output terminal of the state controller 104, an output terminal of the bit line decoder 102 is connected to the bit line of the 1T1R array; the bit line decoder 102 decodes the control signal generated by the state controller 104 to obtain a bit line control signal, and inputs the bit line control signal to the 1T1R devices through the bit line of the 1T1R array.

An input terminal of the source line decoder 100 is connected to the source line output terminal of the state controller 104, an output terminal of the source line decoder 100 is connected to the source line of the 1T1R array; the source line decoder 100 decodes the control signal generated by the state controller 104 to obtain a source line control signal, and inputs the source line control signal to the 1T1R devices through the source line of the 1T1R array.

The word line control signal, the bit line control signal and the source line control signal are commonly applied to the 1T1R array to control states of the 1T1R devices in the 1T1R array.

An input terminal of the signal amplifier 103 is connected to the bit line of the 1T1R array; when data information stored in the 1T1R array is read, the signal amplifier 103 converts an acquired resistance signal stored by the 1T1R device into a voltage signal and then outputs it to the control signal modem 105.

A first input terminal of the control signal modem 105 is connected to the secondary output terminal of the state controller 104, a second input terminal of the control signal modem 105 is connected to an output terminal of the signal amplifier 103; the control signal modem 105 decodes the control signal generated by the state controller 104 to obtain a control signal of a next-stage circuit, or directly transmits the data voltage signal output by the signal amplifier 103; the next-stage circuit is the next 1T1R device in the same 1T1R array, or a next 1T1R array in the compute array.

An input terminal of the data transmission circuit 106 is connected to an output terminal of the control signal modem 105; the data transmission circuit 106 feeds back the data voltage signal output by the control signal modem 105 to the state controller 104 through the result input terminal of the state controller 104, or transmits the control signal output from the control signal modem 105 to a word line decoder, a bit line decoder and a source line decoder of the next-stage circuit.

The data input/output terminal Data, the address input terminal Address and the clock signal input terminal CLK of the state controller 104 respectively serve as a data input/output terminal, an address input terminal and a clock signal input terminal of the computing array.

In the computing array based on 1T1R device, applied voltage pulses are used as input signals to perform logic operation, and the result of the logic operation is characterized by the final resistance state of the 1T1R device; the result of the logic operation can be non-volatilely stored in the resistance state of the device, the resistance state can be read by a read signal of a small current (generally at the nanoampere level) or a small voltage (generally 0.2V or less), and the resistance signal can be erased by applying a voltage pulse with a certain amplitude and pulse width.

In the computing array based on 1T1R device, Boolean logic operations are achieved in the 1T1R devices by applying different voltage pulse signals to the word lines, source lines and bit lines of the 1T1R array. The initial resistance state of the 1T1R device is defined as a logic signal I, in which I=0 when the initial resistance state of the 1T1R device is High Resistance, and I=1 when the initial resistance state of the 1T1R device is Low Resistance; the word line level voltage is defined as a logic signal $V_{WL}$, in which $V_{WL}=0$ when a zero-level pulse is applied to the word line, and $V_{WL}=1$ when a forward voltage pulse is applied to the word line; the bit line level voltage is defined as a logic signal $V_{BL}$, in which $V_{BL}=0$ when a zero-level pulse is applied to the bit line, and $V_{BL}=1$ when a forward voltage pulse is applied to the bit line; the source line level voltage is defined as a logic signal $V_{SL}$, in which $V_{SL}=0$ when a zero-level pulse is applied to the source line, and $V_{SL}=1$ when a forward voltage pulse is applied to the source line; the result of the logical operation in the 1T1R device is non-volatilely stored in the 1T1R device, and when information stored in the 1T1R device is read, the resistance state of the 1T1R device is defined as a logic signal R, in which R=0 when the resistance state of the 1T1R device is High Resistance, and R=1 when the resistance state of the 1T1R device is Low Resistance; and a logical relationship between the logic signal I, the logic signal $V_{WL}$, the logic signal $V_{BL}$, the logic signal $V_{SL}$, and the logic signal R is:

$$R = I \cdot \overline{V_{WL}} + I \cdot V_{WL} \cdot V_{BL} + I \cdot V_{WL} \cdot \overline{V_{BL}} \cdot \overline{V_{SL}} + \overline{I} \cdot V_{WL} \cdot V_{BL} \cdot \overline{V_{ST}}$$

In the computing array based on 1T1R device, Boolean logic operation are implemented in a single 1T1R device, and specifically, the operating method includes the following steps.

(1) Initializing the 1T1R device to obtain a logic signal I.

(2) Respectively applying a voltage pulse signal to a word line, a source line and a bit line to obtain a logic signal $V_{WL}$, a logic signal $V_{SL}$ and a logic signal $V_{BL}$.

(3) Reading a result of the logical operation, that is, a logic signal R.

By controlling values of the logic signals I, $V_{WL}$, $V_{BL}$ and $V_{SL}$, the following 16 Boolean logic operations can be implemented:

implementation of logic 0: I=0, $V_{WL}$=0, $V_{BL}$=p and $V_{SL}$=q;

implementation of logic 1: I=1, $V_{WL}$=0, $V_{BL}$=p and $V_{SL}$=q;

implementation of p logic: I=p, $V_{WL}$=0, $V_{BL}$=0 and $V_{SL}$=q;

implementation of p logic: I=q, $V_{WL}$=0, $V_{BL}$=0 and $V_{SL}$=p;

implementation of $\bar{p}$ logic: I=$\bar{p}$, $V_{WL}$=0, $V_{BL}$=p and $V_{SL}$=q;

implementation of $\bar{q}$ logic: I=$\bar{q}$, $V_{WL}$=0, $V_{BL}$=p and $V_{SL}$=q;

implementation of p+q logic: I=p, $V_{WL}$=1, $V_{BL}$=p and $V_{SL}$=0;

implementation of $\overline{p+q}$ logic: I=1, $V_{WL}$=p, $V_{BL}$=0 and $V_{SL}$=q;

implementation of p·q logic: I=0, $V_{WL}$=p, $V_{BL}$=q and $V_{SL}$=0;

implementation of $\overline{p \cdot q}$ logic: I=$\bar{q}$, $V_{WL}$=p, $V_{BL}$=q and $V_{SL}$=1;

implementation of p+$\bar{q}$ logic: I=1, $V_{WL}$=1, $V_{BL}$=p and $V_{SL}$=q;

implementation of $\bar{p}$+q logic: I=1, $V_{WL}$=p, $V_{BL}$=q and $V_{SL}$=1;

implementation of $\bar{p}$·q logic: I=q, $V_{WL}$=1, $V_{BL}$=0 and $V_{SL}$=p;

implementation of p·$\bar{q}$ logic: I=p, $V_{WL}$=1, $V_{BL}$=0 and $V_{SL}$=q;

implementation of $\bar{p} \cdot q + p \cdot \bar{q}$ logic: I=p, $V_{WL}$=q, $V_{BL}$=$\bar{p}$ and $V_{SL}$=p; and implementation of $p \cdot q + \bar{p} \cdot \bar{q}$ logic: I=$\bar{q}$, $V_{WL}$=p, $V_{BL}$=q and $V_{SL}$=$\bar{q}$.

Further, by inputting a logic signal $V_{WL}$=1 via the word line, a logic signal $V_{BL}$=$V_{read}$ via the bit line and a logic signal $V_{SL}$=0 via the source line, the logic signal stored on the 1T1R device can be read, in which $V_{read}$ is a voltage pulse signal applied when the resistance state of the 1T1R device is read.

In the present invention, symbols similar to I, $V_{WL}$, $V_{BL}$ and $V_{SL}$ are used to denote logical signals with the same concept, and signals corresponding to different 1T1R devices are distinguished only by different subscripts.

Figure 4:
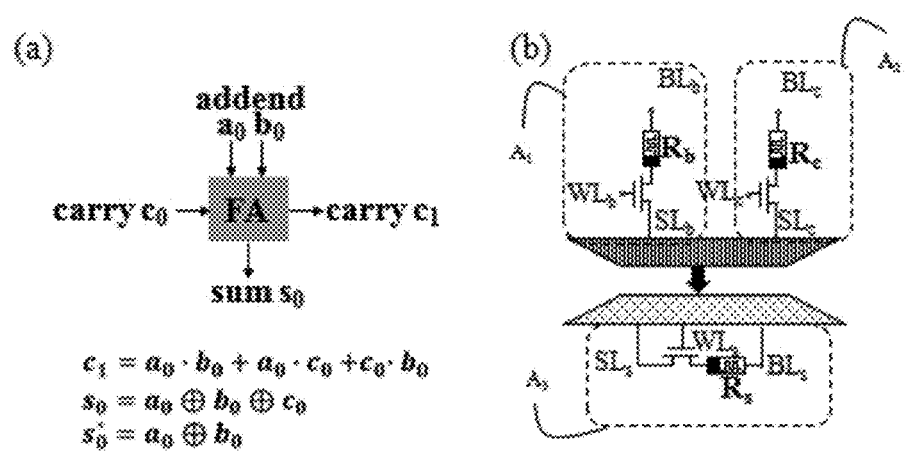
FIG. 4 is a block diagram and an equivalent circuit diagram of an operation circuit of a 1-bit full adder based on the computing array according to an embodiment of the present invention, in which (a) is a block diagram of the operation circuit of the 1-bit full adder; and (b) is an equivalent circuit diagram of the operation circuit of the 1-bit full adder.

FIG. 4 shows an operation circuit based on the computing array according to the present invention for implementing a 1-bit full adder, in which a sum $s_0$ and a high-order carry $c_1$ are calculated according to a logic signal a, a logic signal b and a low-order carry $c_0$ that are input; the operation circuit includes: a 1T1R array $A_1$, a 1T1R array $A_2$ and a 1T1R array $A_3$; the 1T1R array $A_1$ includes a 1T1R device $R_b$ for calculating and storing intermediate data $s_0^*$, a word line signal corresponding to $R_b$ is $V_{WLb}$, a bit line signal corresponding to $R_b$ is $V_{BLb}$ and a source line signal corresponding to $R_b$ is $V_{SLb}$; the 1T1R array $A_2$ includes a 1T1R device $R_c$ for calculating and storing the high-order carry $c_1$, a word line signal corresponding to $R_c$ is $V_{WLc}$, a bit line signal corresponding to $R_c$ is $V_{BLc}$ and a source line signal corresponding to $R_c$ is $V_{SLc}$; the 1T1R array $A_3$ includes a 1T1R device $R_s$ for calculating and storing the sum $s_0$, a word line signal corresponding to $R_s$ is $V_{WLs}$, a bit line signal corresponding to $R_s$ is $V_{BLs}$ and a source line signal corresponding to $R_s$ is $V_{SLs}$; and the intermediate data $s_0^*$ calculated by the 1T1R array $A_1$ and the high-order carry $c_1$ calculated by the 1T1R array $A_2$ are converted by the signal amplifier and the control signal modem, and then transmitted to the 1T1R array $A_3$ through the data transmission circuit.

In conjunction with the operation circuit based on the computing array shown in FIG. 4, an operating method according to the present invention comprises the following steps.

(S1-1) Inputting logic signals $V_{WLc}$=1, $V_{BLc}$=$c_0$ and $V_{SLc}$=$\overline{c_0}$ to write the input logic signal $c_0$ into $R_c$ of the 1T1R array $A_2$; inputting logic signals $V_{WLb}$=1, $V_{BLb}$=$a_0$ and $V_{SLb}$=$\overline{a_0}$, to write the input logic signal $a_0$ into $R_b$ of the 1T1R array $A_1$; inputting logic signals $V_{WLs}$=1, $V_{BLs}$=$a_0$ and $V_{SLs}$=$\overline{a_0}$ to write the input logic signal $a_0$ into $R_s$ of the 1T1R array $A_3$.

(S1-2) Inputting logic signals $V_{WLc}$=1, $V_{BLc}$=$a_0$ and $V_{SLc}$=$\overline{b_0}$ to calculate a high-order carry $c_1 = a_0 \cdot b_0 + a_0 \cdot c_0 + c_0 \cdot b_0$ and store $c_1$ in $R_c$ of the 1T1R array $A_2$; inputting logic signals $V_{WLb}$=$b_0$, $V_{BLb}$=$\overline{a_0}$ and $V_{SLb}$=$a_0$ to calculate an intermediate result $s_0^* = a_0 \oplus b_0$ and store $s_0^*$ in $R_b$ of the 1T1R array $A_1$; inputting logic signals $V_{WLs}$=$b_0$, $V_{BLs}$=$\overline{a_0}$ and $V_{SLs}$=$a_0$ to calculate an intermediate result $s_0^*$ and store $s_0^*$ in $R_s$ of the 1T1R array $A_3$.

(S1-3) reading the logic signal $c_1$ stored in $R_c$ of the 1T1R array $A_2$; reading the logic signal $s_0^*$ stored in $R_b$ of the 1T1R array $A_1$; inputting logic signals $V_{WLs}$=$c_0$, $V_{BLs}$=$\overline{s_0^*}$ and $V_{SLs}$=$s_0^*$ to calculate a sum $s_0 = a_0 \oplus b_0 \oplus c_0$ and store $s_0$ in $R_s$ of the 1T1R array $A_3$.

(S1-4) reading the logic signal $s_0$ stored in $R_s$ of the 1T1R array $A_3$.

Figure 5:
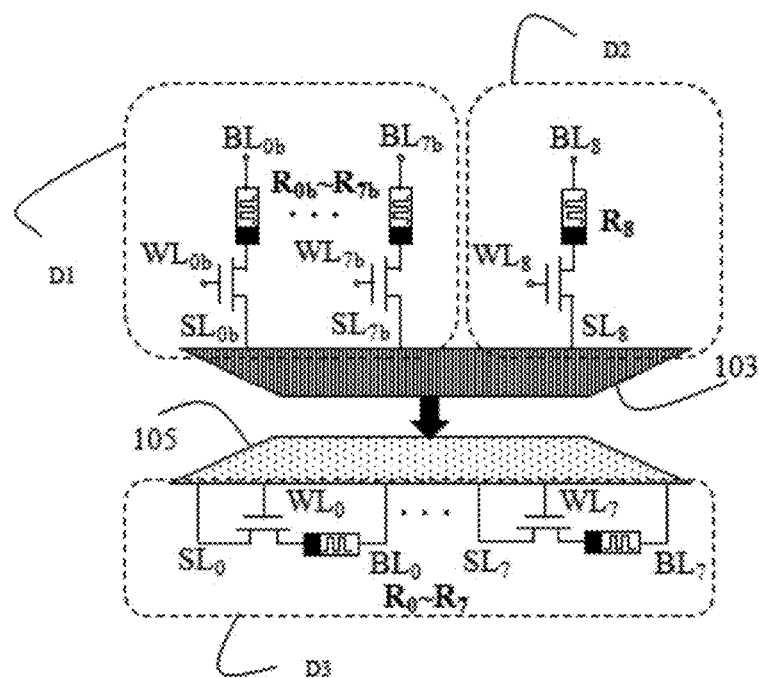
FIG. 5 is an equivalent circuit diagram of an operation circuit of an 8-bit step-by-step carry adder based on the computing array according to an embodiment of the present invention.

FIG. 5 shows an operation circuit based on the computing array according to the present invention for implementing an 8-bit step-by-step carry adder, in which sums $s_{0\sim7}$ and carry information $c_8$ are calculated according to input data $a_{0\sim7}$ and $b_{0\sim7}$ and carry information $c_0$; the operation circuit includes: a 1T1R array $D_1$, a 1T1R array $D_2$ and a 1T1R array $D_3$; the 1T1R array $D_1$ includes eight 1T1R devices $R_{0b}$~$R_{7b}$ for calculating and storing intermediate results, word line control signals corresponding to $R_{0b}$~$R_{7b}$ are respectively $V_{WL0b}$~$V_{WL7b}$, bit line control signals corresponding to $R_{0b}$~$R_{7b}$ are respectively $V_{BL0b}$~$V_{BL7b}$, and source line control signals corresponding to $R_{0b}$~$R_{7b}$ are respectively $V_{SL0b}$~$V_{SL7b}$; the 1T1R array $D_1$ is used for data backup; the 1T1R array $D_2$ includes a 1T1R device $R_8$ for calculating and storing carry data $c_i$ (i is an integer from 0 to 8), a word line control signal corresponding to $R_8$ is $V_{WL8}$, a bit line control signal corresponding to $R_8$ is $V_{BL8}$ and a source line control signal corresponding to $R_8$ is $V_{SL8}$; the 1T1R array $D_3$ includes eight 1T1R devices $R_0$~$R_7$ for calculating and storing addition operation results $s_{0\sim7}$, word line control signals corresponding to $R_0$~$R_7$ are respectively $V_{WL0}$~$V_{WL7}$, bit line control signals corresponding to $R_0$~$R_7$ are respectively $V_{BL0}$~$V_{BL7}$, and source line control signals corresponding to $R_0$~$R_7$ are respectively $V_{SL0}$~$V_{SL7}$; and the intermediate data $s_{0\sim7}^*$ calculated by the 1T1R array $D_1$ and the carry information $c_1$ calculated by the 1T1R array $D_2$ are converted by the signal amplifier and the control signal modem, and then transmitted to the 1T1R array $D_3$ through the data transmission circuit.

In conjunction with the operation circuit based on the computing array shown in FIG. 5, an operating method according to the present invention comprises the following steps.

(S2-1) Inputting logic signals $V_{WL0\sim7}$=1, $V_{BL0\sim7}$=$a_{0\sim7}$ and $V_{SL0\sim7}$=$\overline{a_{0\sim7}}$ to write the input data $a_{0\sim7}$ into $R_0$~$R_7$ of the 1T1R array $D_3$; inputting logic signals $V_{WL8}$=1, $V_{BL8}$=$c_0$ and $V_{SL8}$=$\overline{c_0}$ to write the lower-order carry $c_0$ into $R_8$ of the 1T1R array $D_2$.

(S2-2) inputting logic signals $V_{WL0\sim7}=b_{0\sim7}$, $V_{BL0\sim7}=\overline{a_{0\sim7}}$ and $V_{SL0\sim7}=a_{0\sim7}$ to calculate intermediate results $s_{0\sim7}{}^*=a_{0\sim7}\oplus b_{0\sim7}$ and store $s_{0\sim7}{}^*$ in $R_0\sim R_7$ of the 1T1R array $D_3$; inputting logic signals $V_{WL0b\sim7b}=b_{0\sim7}$, $V_{BL0b\sim7b}=\overline{a_{0\sim7}}$ and $V_{SL0b\sim7b}=a_{0\sim7}$ to calculate intermediate results $s_{0\sim7}{}^*$ and store $s_{0\sim7}{}^*$ in $R_{0b}\sim R_{7b}$ of the 1T1R array $D_1$; inputting logic signals $V_{WL8}=1$, $V_{BL8}=a_0$ and $V_{SL8}=\overline{b_0}$ to calculate $c_1=a_0 \cdot b_0+a_0 \cdot c_0+c_0 \cdot b_0$ and store $c_1$ in $R_8$ of the 1T1R array $D_2$.

(S2-3) Reading $s_0{}^*$ from $R_{0b}$ of the 1T1R array $D_1$, and reading $s_1{}^*$ from $R_{1b}$ of the 1T1R array D1; inputting logic signals $V_{WL0}=c_0$, $V_{WL1}=c_1$, $V_{WL2\sim7}=0$, $V_{BL0}=\overline{s_0{}^*}$, $V_{BL1}=\overline{s_1{}^*}$, $V_{BL2\sim7}=0$, $V_{SL0}=s_0{}^*$, $V_{SL1}=s_1{}^*$ and $V_{SL2\sim7}=0$ to calculate $s_0=a_0 \oplus b_0 \oplus c_0$ and $s_1=a_1 \oplus b_1 \oplus c_1$, and store $s_0$ in $R_0$ of the 1T1R array $D_3$ and $s_1$ in $R_1$ of the 1T1R array $D_3$.

(S2-4) Inputting logic signals $V_{WL8}=1$, $V_{BL8}=a_1$ and $V_{SL8}=\overline{b_1}$ to calculate $c_2=a_1 \cdot b_1+a_1 \cdot c_1+c_1 \cdot b_1$ and store $c_2$ in $R_8$ of the 1T1R array $D_2$.

(S2-5) Reading $s_2{}^*$ from $R_{2b}$ of the 1T1R array $D_1$; inputting logic signals $V_{WL0\sim1}=0$, $V_{WL2}=c_2$, $V_{WL3\sim7}=0$, $V_{BL0\sim1}=0$, $V_{BL2}=\overline{s_2{}^*}$, $V_{BL3\sim7}=0$, $V_{SL0\sim1}=0$, $V_{SL2}=s_2{}^*$ and $V_{SL3\sim7}=0$ to calculate $s_2=a_2 \oplus b_2 \oplus c_2$ and store $s_2$ in $R_2$ of the 1T1R array $D_3$.

(S2-6) Inputting logic signals $V_{WL8}=1$, $V_{BL8}=a_2$ and $V_{SL8}=\overline{b_2}$ to calculate $c_3=a_2 \cdot b_2+a_2 \cdot c_2+c_2 \cdot b_2$ and store $c_3$ in $R_8$ of the 1T1R array $D_2$.

(S2-7) Reading $s_3{}^*$ from $R_{3b}$ of the 1T1R array $D_1$; inputting logic signals $V_{WL0\sim2}=0$, $V_{WL3}=c_3$, $V_{WL4\sim7}=0$, $V_{BL0\sim2}=0$, $V_{BL3}=\overline{s_3{}^*}$, $V_{BL4\sim7}=0$, $V_{SL0\sim2}=0$, $V_{SL3}=s_3{}^*$ and $V_{SL4\sim7}=0$ to calculate $s_3=a_3 \oplus b_3 \oplus c_3$ and store $s_3$ in $R_3$ of the 1T1R array $D_3$.

(S2-8) inputting logic signals $V_{WL8}=1$, $V_{BL8}=a_3$ and $V_{SL8}=\overline{b_3}$ to calculate $c_4=a_3 \cdot b_3+a_3 \cdot c_3+c_3 \cdot b_3$ and store $c_4$ in $R_8$ of the 1T1R array $D_2$.

(S2-9) Reading $s_4{}^*$ from $R_{4b}$ of the 1T1R array $D_1$; inputting logic signals $V_{WL0\sim3}=0$, $V_{WL4}=c_4$, $V_{WL5\sim7}=0$, $V_{BL0\sim3}=0$, $V_{BL4}=\overline{s_4{}^*}$, $V_{BL5\sim7}=0$, $V_{SL0\sim3}=0$, $V_{SL4}=s_4{}^*$ and $V_{SL5\sim7}=0$ to calculate $s_4=a_4 \oplus b_4 \oplus c_4$ and store $s_4$ in $R_4$ of the 1T1R array $D_3$.

(S2-10) Inputting logic signals $V_{WL8}=1$, $V_{BL8}=a_4$ and $V_{SL8}=\overline{b_4}$ to calculate $c_5=a_4 \cdot b_4+a_4 \cdot c_4+c_4 \cdot b_4$ and store $c_5$ in $R_8$ of the 1T1R array $D_2$.

(S2-11) Reading $s_5{}^*$ from $R_{5b}$ of the 1T1R array $D_1$; inputting logic signals $V_{WL0\sim4}=0$, $V_{WL5}=c_5$, $V_{WL6\sim7}=0$, $V_{BL0\sim4}=0$, $V_{BL5}=\overline{s_5{}^*}$, $V_{BL6\sim7}=0$, $V_{SL0\sim4}=0$, $V_{SL5}=s_5{}^*$ and $V_{SL6\sim7}=0$ to calculate $s_5=a_5 \oplus b_5 \oplus c_5$ and store $s_5$ in $R_5$ of the 1T1R array $D_3$.

(S2-12) Inputting logic signals $V_{WL8}=1$, $V_{BL8}=a_5$ and $V_{SL8}=\overline{b_5}$ to calculate $c_6=a_5 \cdot b_5+a_5 \cdot c_5+c_5 \cdot b_5$ and store $c_6$ in $R_8$ of the 1T1R array $D_2$.

(S2-13) Reading $s_6{}^*$ from $R_{6b}$ of the 1T1R array $D_1$; inputting logic signals $V_{WL0\sim5}=0$, $V_{WL6}=c_6$, $V_{WL7}=0$, $V_{BL0\sim5}=0$, $V_{BL6}=\overline{s_6{}^*}$, $V_{BL7}=0$, $V_{SL0\sim5}=0$, $V_{SL6}=s_6{}^*$ and $V_{SL7}=0$ to calculate $s_6=a_6 \oplus b_6 \oplus c_6$ and store $s_6$ in $R_6$ of the 1T1R array $D_3$.

(S2-14) Inputting logic signals $V_{WL8}=1$, $V_{BL8}=a_6$ and $V_{SL8}=\overline{b_6}$ to calculate $c_7=a_6 \cdot b_6+a_6 \cdot c_6+c_6 \cdot b_6$ and store $c_7$ in $R_8$ of the 1T1R array $D_2$.

(S2-15) Reading $s_7{}^*$ from $R_{7b}$ of the 1T1R array $D_1$; inputting logic signals $V_{WL0\sim6}=0$, $V_{WL7}=c_7$, $V_{BL0\sim6}=0$, $V_{BL7}=\overline{s_7{}^*}$, $V_{SL0\sim6}=0$ and $V_{SL7}=s_7{}^*$ to calculate $s_7=a_7 \oplus b_7 \oplus c_7$ and store $s_7$ in $R_7$ of the 1T1R array $D_3$.

(S2-16) Inputting logic signals $V_{WL8}=1$, $V_{BL8}=a_7$ and $V_{SL8}=\overline{b_7}$ to calculate $c_8=a_7 \cdot b_7+a_7 \cdot c_7+c_7 \cdot b_7$ and store $c_8$ in $R_8$ of the 1T1R array $D_2$.

Figure 6:
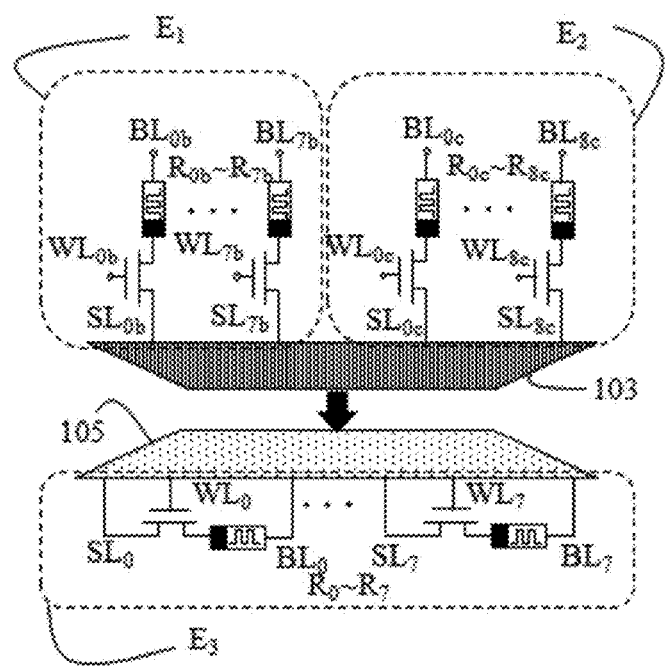
FIG. 6 is an equivalent circuit diagram of an operation circuit of an optimized 8-bit step-by-step carry adder based on the computing array according to an embodiment of the present invention.

FIG. 6 shows an operation circuit based on the computing array according to the present invention for implementing an optimized 8-bit step-by-step carry adder, in which sums $s_{0\sim7}$ and carry information $c_8$ are calculated according to input data $a_{0\sim7}$ and $b_{0\sim7}$ and carry information $c_0$; the operation circuit includes: a 1T1R array $E_1$, a 1T1R array $E_2$ and a 1T1R array $E_3$; the 1T1R array $E_1$ includes eight 1T1R devices $R_{0b}\sim R_{7b}$ for calculating and storing data $s_{0\sim7}{}^*$, word line control signals corresponding to $R_{0b}\sim R_{7b}$ are respectively $V_{WL0b}\sim V_{WL7b}$, bit line control signals corresponding to $R_{0b}\sim R_{7b}$ are respectively $V_{BL0b}\sim V_{BL7b}$, and source line control signals corresponding to $R_{0b}\sim R_{7b}$ are respectively $V_{SL0b}\sim V_{SL7b}$; the 1T1R array $E_1$ is used for data backup; the 1T1R array $E_2$ includes nine 1T1R devices $R_{0c}\sim R_{8c}$ for calculating and storing carry data $c_i$ (i is an integer from 0 to 8), word line control signals corresponding to $R_{0c}\sim R_{8c}$ are respectively $V_{WL0c}\sim V_{WL8c}$, bit line control signals corresponding to $R_{0c}\sim R_{8c}$ are respectively $V_{BL0c}\sim V_{BL8c}$, and source line control signals corresponding to $R_{0c}\sim R_{8c}$ are respectively $V_{SL0c}\sim V_{SL8c}$; the 1T1R array $E_3$ includes eight 1T1R devices $R_0\sim R_7$ for calculating and storing addition operation results $s_{0\sim7}$; and the intermediate data $s_{0\sim7}{}^*$ calculated by the 1T1R array $E_1$ and the carry information $c_i$ calculated by the 1T1R array $E_2$ are converted by the signal amplifier and the control signal modem, and then transmitted to the 1T1R array $E_3$ through the data transmission circuit.

In conjunction with the operation circuit based on the computing array shown in FIG. 6, an operating method according to the present invention comprises the following steps.

(S3-1) inputting logic signals $V_{WL0\sim7}=1$, $V_{BL0\sim7}=a_{0\sim7}$ and $V_{SL0\sim7}=\overline{a_{0\sim7}}$ to write the input operational data $a_{0\sim7}$ into $R_0\sim R_7$ of the 1T1R array $E_3$; inputting logic signals $V_{WL0b\sim7b}=1$, $V_{BL0b\sim7b}=a_{0\sim7}$ and $V_{SL0b\sim7b}=\overline{a_{0\sim7}}$ to write the input operational data $a_{0\sim7}$ into $R_{0b}\sim R_{7b}$ of the 1T1R array $E_1$; inputting logic signals $V_{WL0c\sim8c}=1$, $V_{BL0c\sim8}=c_0$ and $V_{SL0c\sim8c}=\overline{c_0}$ to write the carry information $c_0$ into $R_{0c}\sim R_{8c}$ of the 1T1R array $E_2$.

(S3-2) Inputting logic signals $V_{WL0\sim7}=b_{0\sim7}$, $V_{BL0\sim7}=\overline{a_{0\sim7}}$ and $V_{SL0\sim7}=a_{0\sim7}$ to calculate intermediate results $s_{0\sim7}{}^*=a_{0\sim7}\oplus b_{0\sim7}$ and store $s_{0\sim7}{}^*$ in $R_0\sim R_7$ of the 1T1R array $E_3$; inputting logic signals $V_{WL0b\sim7b}=b_{0\sim7}$, $V_{BL0b\sim7b}=\overline{a_{0\sim7}}$ and $V_{SL0b\sim7b}=a_{0\sim7}$ to calculate intermediate results $s_{0\sim7}{}^*$ and store $s_{0\sim7}{}^*$ in $R_{0b}\sim R_{7b}$ of the 1T1R array $E_1$; inputting logic signals $V_{WL0c}=0$, $V_{WL1c\sim8c}=1$, $V_{BL0c\sim8c}=a_0$ and $V_{SL0c\sim8c}=\overline{b_0}$ to calculate $c_1=a_0 \cdot b_0+a_0 \cdot c_0+c_0 \cdot b_0$ and store $c_1$ in $R_{1c\sim8c}$ of the 1T1R array $E_2$.

(S3-3) Reading $s_0{}^*$ from $R_{0b}$ of the 1T1R array $E_1$, and reading $s_1{}^*$ from $R_{1b}$ of the 1T1R array E1; inputting logic signals $V_{WL0}=c_0$, $V_{WL1}=c_1$, $V_{WL2\sim7}=0$, $V_{BL0}=\overline{s_0{}^*}$, $V_{BL1}=\overline{s_1{}^*}$, $V_{BL2\sim7}=0$, $V_{SL0}=s_0{}^*$, $V_{SL1}=s_1{}^*$ and $V_{SL2\sim7}=0$ to calculate $s_0=a_0 \oplus b_0 \oplus c_0$ and $s_1=a_1 \oplus b_1 \oplus c_1$, and store so in $R_0$ of the 1T1R array $E_3$ and $s_1$ in $R_1$ of the 1T1R array $E_3$; inputting logic signals $V_{WL0c\sim1c}=0$, $V_{WL2c\sim8c}=1$, $V_{BL0c\sim8c}=a_1$ and $V_{SL0c\sim8c}=\overline{b_1}$ to calculate $c_2=a_1 \cdot b_1+a_1 \cdot c_1+c_1 \cdot b_1$ and store $c_2$ in $R_{2c\sim8c}$ of the 1T1R array $E_2$.

(S3-4) Reading $s_2{}^*$ from $R_{2b}$ of the 1T1R array $E_1$; inputting logic signals $V_{WL0\sim1}=0$, $V_{WL2}=c_2$, $V_{WL3\sim7}=0$, $V_{BL0\sim1}=0$, $V_{BL2}=\overline{s_2{}^*}$, $V_{BL3\sim7}=0$, $V_{SL0\sim1}=0$, $V_{SL2}=\overline{s_2{}^*}$ and $V_{SL3\sim7}=0$ to calculate $s_2=a_2 \oplus b_2 \oplus c_2$, and store $s_2$ in $R_2$ of the 1T1R array $E_3$; inputting logic signals $V_{WL0\sim2c}=0$, $V_{WL3c\sim8c}=1$, $V_{BL0c\sim8c}=a_2$ and $V_{SL0c\sim8c}=\overline{b_2}$ to calculate $c_3=a_2 \cdot b_2+a_2 \cdot c_2+c_2 \cdot b_2$ and store $c_3$ in $R_{3c\sim8c}$ of the 1T1R array $E_2$.

(3-5) Reading $s_3{}^*$ from $R_{3b}$ of the 1T1R array $E_1$; inputting logic signals $V_{WL0\sim2}=0$, $V_{WL3}=c_3$, $V_{WL4\sim7}=0$, $V_{BL0\sim2}=0$, $V_{BL3}=\overline{s_3{}^*}$, $V_{BL4\sim7}=0$, $V_{SL0\sim2}=0$, $V_{SL3}=s_3{}^*$ and $V_{SL4\sim7}=0$ to calculate $s_3=a_3 \oplus b_3 \oplus c_3$ and store $s_3$ in $R_3$ of the 1T1R array $D_3$; inputting logic signals $V_{WL0c\sim3c}=0$, $V_{WL4c\sim8c}=1$, $V_{BL0c\sim8c}=a_3$ and $V_{SL0c\sim8c}=\overline{b_3}$ to calculate $c_4=a_3\cdot b_3+a_3\cdot c_3+c_3\cdot b_3$ and store $c_4$ in $R_{4c\sim8c}$ of the 1T1R array $E_2$.

(3-6) Reading $s_4*$ from $R_{4b}$ of the 1T1R array $E_1$; inputting logic signals $V_{WL0\sim3}=0$, $V_{WL4}=c_4$, $V_{WL5\sim7}=0$, $V_{BL0\sim3}=0$, $V_{BL4}=\overline{s_4*}$, $V_{BL5\sim7}=0$, $V_{SL0\sim3}=0$, $V_{SL4}=s_4*$ and $V_{SL5\sim7}=0$ to calculate $s_4=a_4\oplus b_4\oplus c_4$ and store $s_4$ in $R_4$ of the 1T1R array $E_3$; inputting logic signals $V_{WL0c\sim4c}=0$, $V_{WL5c\sim8c}=1$, $V_{BL0c\sim8c}=a_4$ and $V_{SL0c\sim8c}=\overline{b_4}$ to calculate $c_5=a_4\cdot b_4+a_4\cdot c_4+c_4\cdot b_4$ and store $c_5$ in $R_{5c\sim8c}$ of the 1T1R array $E_2$.

(3-7) Reading $s_5*$ from $R_{5b}$ of the 1T1R array $E_1$; inputting logic signals $V_{WL0\sim4}=0$, $V_{WL5}=c_5$, $V_{WL6\sim7}=0$, $V_{BL0\sim4}=0$, $V_{BL5}=\overline{s_5*}$, $V_{BL6\sim7}=0$, $V_{SL0\sim4}=0$, $V_{SL5}=s_5*$ and $V_{SL6\sim7}=0$ to calculate $s_5=a_5\oplus b_5\oplus c_5$ and store $s_5$ in $R_5$ of the 1T1R array $E_3$; inputting logic signals $V_{WL0\sim5c}=1$, $V_{WL6c\sim8c}=1$, $V_{BL0c\sim8c}=a_5$ and $V_{SL0c\sim8c}=\overline{b_5}$ to calculate $c_6=a_5\cdot b_5+a_5\cdot c_5+c_5\cdot b_5$ and store $c_6$ in $R_{6c\sim8c}$ of the 1T1R array $E_2$.

(3-8) Reading $s_6*$ from $R_{6b}$ of the 1T1R array $E_1$; inputting logic signals $V_{WL0\sim5}=0$, $V_{WL6}=c_6$, $V_{WL7}=0$, $V_{BL0\sim5}=0$, $V_{BL6}=\overline{s_6*}$, $V_{BL7}=0$, $V_{SL0\sim5}=0$, $V_{SL6}=s_6*$ and $V_{SL7}=0$ to calculate $s_6=a_6\oplus b_6\oplus c_6$ and store $s_6$ in $R_6$ of the 1T1R array $E_3$; inputting logic signals $V_{WL7c\sim8c}=1$, $V_{BL0c\sim8c}=a_6$ and $V_{SL0c\sim8c}=\overline{b_6}$ to calculate $c_7=a_6\cdot b_6+a_6\cdot c_6+c_6\cdot b_6$ and store $c_7$ in $R_{7c\sim8c}$ of the 1T1R array $E_2$.

(3-9) Reading $s_7*$ from $R_{7b}$ of the 1T1R array E1; inputting logic signals $V_{WL0\sim6}=0$, $V_{WL7}=c_7$, $V_{BL0\sim6}=0$, $V_{BL7}=\overline{s_7*}$, $s_{L0\sim6}=0$ and $V_{SL7}=\overline{s_7*}$ to calculate $s_7=a_7\oplus b_7\oplus c_7$ and store $s_7$ in $R_7$ of the 1T1R array $E_3$; and inputting logic signals $V_{WL0c\sim7c}=0$, $V_{WL8c}=1$, $V_{BL0c\sim8c}=a_7$ and $V_{SL0c\sim8c}\overline{b_7}$ to calculate $c_8=a_7\cdot b_7+a_7\cdot c_7+c_7\cdot b_7$ and store $c_8$ in $R_{8c}$ of the 1T1R array $E_2$.

Figure 7:
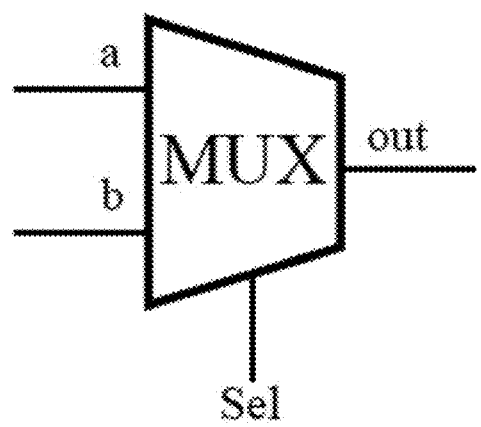
FIG. 7 is a block diagram and an equivalent circuit diagram of an operation circuit of a 2-bit data selector based on the computing array according to an embodiment of the present invention, in which (a) is a block diagram of the operation circuit of the 2-bit data selector; and (b) is an equivalent circuit diagram of the operation circuit of the 2-bit data selector.
Figure 7:
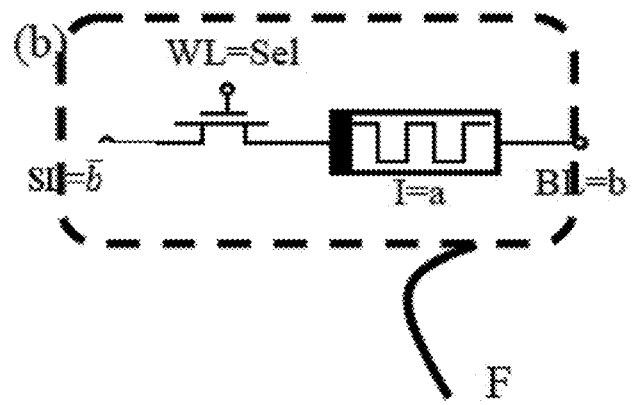

FIG. 7 shows an operation circuit based on the computing array according to the present invention for implementing a 2-bit data selector, in which a logic signal a, a logic signal b and a control signal Sel are input to output the logic signal a or the logic signal b by controlling a value of the control signal Sel; and the operation circuit includes a 1T1R array F, and the 1T1R array F includes one 1T1R device R.

In conjunction with the operation circuit based on the computing array shown in FIG. 7, an operating method according to the present invention comprises the following steps.

(S4-1) Inputting logic signals $V_{WL}=1$, $V_{BL}=a$ and $V_{SL}=\overline{a}$ to initialize the 1T1R device R, and write the input logic signal a into R of the 1T1R array F.

(S4-2) inputting logic signals $V_{WL}=$Sel, $V_{BL}=b$ and $V_{SL}=\overline{b}$ to input the logic signal b and the control signal Sel so as to select an output logic signal out, wherein the logic signal a and the logic signal b represent only two independent logic signals; when the control signal Sel=0, the output signal out=a; and when the control signal Sel=1, the output signal out=b.

Figure 8:
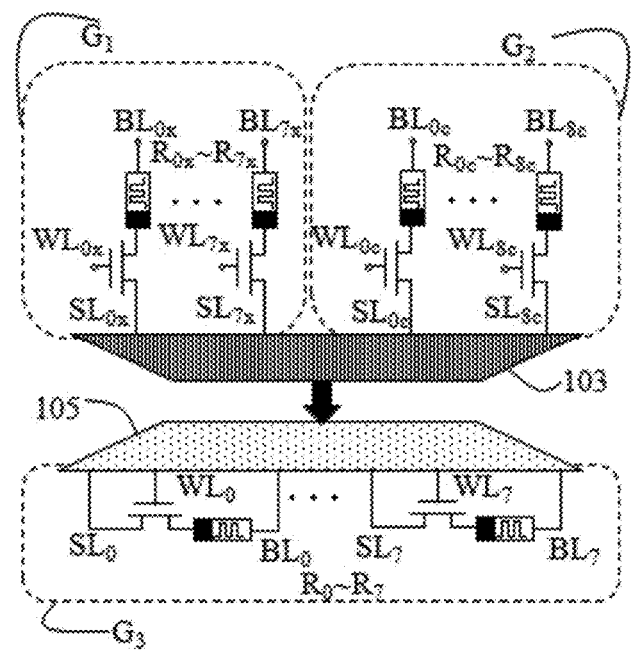
FIG. 8 is an equivalent circuit diagram of an operation circuit of an 8-bit carry select adder based on the computing array according to an embodiment of the present invention.

FIG. 8 shows an operation circuit based on the computing array according to the present invention for implementing an 8-bit carry select adder, in which sums $s_{0\sim7}$ and carry information $c_8$ are calculated according to input data $a_{0\sim7}$ and $b_{0\sim7}$ and carry information $c_0$, and in the calculation process, according to the carry information of each bit, an XNOR operation result or an XOR operation result of the corresponding bit of the operation data is selected as bit information of the sum; the operation circuit includes a 1T1R array $G_1$, a 1T1R array $G_2$ and a 1T1R array $G_3$; the 1T1R array $G_1$ includes eight 1T1R devices $R_{0x}\sim R_{7x}$ for calculating and storing XNOR operation results of data $a_{0\sim7}$ and $b_{0\sim7}$ ($X_{0\sim7}=a_{0\sim7}$ XNOR $b_{0\sim7}$), word line control signals corresponding to $R_{0x}\sim R_{7x}$ are respectively $V_{WL0x}\sim V_{WL7x}$, bit line control signals corresponding to $R_{0x}\sim R_{7x}$ are respectively $V_{BL0x}\sim V_{BL7x}$, and source line control signals corresponding to $R_{0x}\sim R_{7x}$ are respectively $V_{SL0x}\sim V_{SL7x}$; the 1T1R array $G_2$ includes nine 1T1R devices $R_{0c}\sim R_{8c}$ for calculating carry data $c_i$ (i is an integer from 0 to 8), word line control signals corresponding to $R_{0c}\sim R_{8c}$ are respectively $V_{WL0c}\sim V_{WL8c}$, bit line control signals corresponding to $R_{0c}\sim R_{8c}$ are respectively $V_{BL0c}\sim V_{BL8c}$, and source line control signals corresponding to $R_{0c}\sim R_{8c}$ are respectively $V_{SL0c}\sim V_{SL8c}$; the 1T1R array $G_3$ includes eight 1T1R devices $R_0\sim R_7$ for calculating and storing addition operation results $s_{0\sim7}$, word line control signals corresponding to $R_0\sim R_7$ are respectively $V_{WL0}\sim V_{WL7}$, bit line control signals corresponding to $R_0\sim R_7$ are respectively $V_{BL0}\sim V_{BL7}$, and source line control signals corresponding to $R_0\sim R_7$ are respectively $V_{SL0}\sim V_{SL7}$; and the XNOR operation results $X_{0\sim7}$ calculated by the 1T1R array $G_1$ and the carry information $c_i$ calculated by the 1T1R array $G_2$ are converted by the signal amplifier and the control signal modem, and then transmitted to the 1T1R array $G_3$ through the data transmission circuit.

In conjunction with the operation circuit based on the computing array shown in FIG. 8, an operating method according to the present invention comprises the following steps.

(S5-1) Inputting logic signals $V_{WL0x\sim7x}=1$, $V_{BL0x\sim7x}=\overline{b_{0\sim7}}$ and $V_{SL0x\sim7x}=b_{0\sim7}$ to store the result $\overline{b_{0\sim7}}$ of inverting the input operation data $b_{0\sim7}$ in $R_{0x}\sim R_{7x}$ of the 1T1R array G1; inputting logic signals $V_{WL0c\sim8c}=1$, $V_{BL0c\sim8c}=c_0$ and $V_{SL0c\sim8c}=\overline{c_0}$ to store $c_0$ in $R_{0c}\sim R_{8c}$ of the 1T1R array $G_2$; inputting logic signals $V_{WL0\sim7}=1$, $V_{BL0\sim7}=a_{0\sim7}$ and $V_{SL0\sim7}=\overline{a_{0\sim7}}$ to store the input operational data $a_{0\sim7}$ in $R_0\sim R_7$ of the 1T1R array $G_3$.

(S5-2) Inputting logic signals $V_{WL0x\sim7x}=a_{0\sim7}$, $V_{BL0x\sim7x}=b_{0\sim7}$ and $V_{SL0x\sim7x}=\overline{b_{0\sim7}}$ to calculate XNOR operation results $X_{0\sim7}=a_{0\sim7}$ XNOR $b_{0\sim7}$ of the calculated data $a_{0\sim7}$ and $b_{0\sim7}$ and store $X_{0\sim7}$ in $R_{0x}\sim R_{7x}$ of the 1T1R array $G_1$; inputting logic signals $V_{WL0c}=0$, $V_{WL1c\sim8c}=1$, $V_{BL0c\sim8c}=a_0$ and $V_{SL0c\sim8c}=\overline{b_0}$ to calculate $c_1=a_0\cdot b_0+a_0\cdot c_0+c_0\cdot b_0$ and store $c_1$ in $R_{1c\sim8c}$ of the 1T1R array $G_2$; inputting logic signals $V_{WL0\sim7}=b_{0\sim7}$, $V_{BL0\sim7}=a_{0\sim7}$ and $V_{SL0\sim7}=\overline{a_{0\sim7}}$ to calculate XOR operation results $s_{0\sim7}*=a_{0\sim7}\oplus b_{0\sim7}$ and store $s_{0\sim7}*$ in $R_0\sim R_7$ of the 1T1R array $G_3$.

(S5-3) Inputting logic signals $V_{WL0c\sim1c}=0$, $V_{WL2c\sim8c}=1$, $V_{BL0c\sim8c}=a_1$ and $V_{SL0c\sim8c}=\overline{b_1}$ to calculate $c_2=a_1\cdot b_1+a_1\cdot c_1+c_1\cdot b_1$ and store $c_2$ in $R_{2c\sim8c}$ of the 1T1R array $G_2$; inputting logic signals $V_{WL0}=c_0$, $V_{WL1}=c_1$, $V_{WL2\sim7}=0$, $V_{BL0\sim7}=X_{0\sim7}$ and $V_{SL0\sim7}=\overline{X_{0\sim7}}$ to calculate $s_0$ and $s_1$ and store $s_0$ in $R_0$ of the 1T1R array $G_3$ and $s_1$ in $R_1$ of the 1T1R array $G_3$; when $c_0=0$, $s_0=a_0\oplus b_0$, and when $c_1=0$, $s_0=\overline{a_0\oplus b_0}$; when $c_1=0$, $s_1=a_1\oplus b_1$, and when $c_1=1$, $s_1=\overline{a_1\oplus b_1}$.

(S5-4) Inputting logic signals $V_{WL0c\sim2c}=0$, $V_{WL3c\sim8c}=1$, $V_{BL0c\sim8c}=a_2$ and $V_{SL0c\sim8c}=\overline{b_2}$ to calculate $c_3=a_2\cdot b_2+a_2\cdot c_2+c_2\cdot b_2$ and store $c_3$ in $R_{3c\sim8c}$ of the 1T1R array $G_2$; inputting logic signals $V_{WL0\sim1}=0$, $V_{WL2}=c_2$, $V_{WL3\sim7}=0$, $V_{BL0\sim7}=X_{0\sim7}$ and $V_{SL0\sim7}=\overline{X_{0\sim7}}$ to calculate $s_2$ and store $s_2$ in $R_2$ of the 1T1R array $G_3$; when $c_2=0$, $s_2=a_2\oplus b_2$, and when $c_2=1$, $s_2=s_2=\overline{a_2\oplus b_2}$.

(S5-5) Inputting logic signals $V_{WL0c\sim3c}=0$, $V_{WL4c\sim8c}=1$, $V_{BL0c\sim8c}=a_3$ and $V_{SL0c\sim8c}=\overline{b_3}$ to calculate $c_4=a_3\cdot b_3+a_3\cdot c_3+c_3\cdot b_3$ and store $c_4$ in $R_{4c\sim8c}$ of the 1T1R array $G_2$; inputting logic signals $V_{WL0\sim2}=0$, $V_{WL3}=c_3$, $V_{WL4\sim7}=0$, $V_{BL0\sim7}=X_{0\sim7}$ and $V_{SL0\sim7}=\overline{X_{0\sim7}}$ to calculate $s_3$ and store $s_3$ in $R_3$ of the 1T1R array $G_3$; when $c_3=0$, $s_3=a_3\oplus b_3$, and when $c_3=1$, $s_3=\overline{a_3\oplus b_3}$.

(S5-6) Inputting logic signals $V_{WL0c\sim4c}=0$, $V_{WL5c\sim8c}=1$, $V_{BL0c\sim8c}=a_4$ and $V_{SL0c\sim8c}=\overline{b_4}$ to calculate $c_5=a_4 \cdot b_4+a_4 \cdot c_4+c_4 \cdot b_4$ and store $c_5$ in $R_{5c\sim8c}$ of the 1T1R array $G_2$; inputting logic signals $V_{WL0\sim3}=0$, $V_{WL4}=c_4$, $V_{WL5\sim7}=0$, $V_{BL0\sim7}=X_{0\sim7}$ and $V_{SL0\sim7}=\overline{X_{0\sim7}}$ to calculate $s_4$ and store $s_4$ in $R_4$ of the 1T1R array $G_3$; when $c_4=0$, $s_4=a_4 \oplus b_4$, and when $c_4=1$, $s_4=\overline{a_4 \oplus b_4}$.

(S5-7) Inputting logic signals $V_{WL0c\sim5c}=0$, $V_{WL6c\sim8c}=1$, $V_{BL0c\sim8c}=a_5$ and $V_{SL0c\sim8c}=\overline{b_5}$ to calculate $c_6=a_5 \cdot b_5+a_5 \cdot c_5+c_5 \cdot b_5$ and store $c_6$ in $R_{6c\sim8c}$ of the 1T1R array $G_2$; inputting logic signals $V_{WL0\sim4}=0$, $V_{WL5}=c_5$, $V_{WL6\sim7}=0$, $V_{BL0\sim7}=X_{0\sim7}$ and $V_{SL0\sim7}=\overline{X_{0\sim7}}$ to calculate $s_5$ and store $s_5$ in $R_5$ of the 1T1R array $G_3$; when $c_5=0$, $s_5=a_5 \oplus b_5$, and when $c_5=1$, $s_5=\overline{a_5 \oplus b_5}$.

(S5-8) Inputting logic signals $V_{WL0c\sim6c}=0$, $V_{WL7c\sim8c}=1$, $V_{BL0c\sim8c}=a_6$ and $V_{SL0c\sim8c}=\overline{b_6}$ to calculate $c_7=a_6 \cdot b_6+a_6 \cdot c_6+c_6 \cdot b_6$ and store $c_7$ in $R_{7c\sim8c}$ of the 1T1R array $G_2$; inputting logic signals $V_{WL0\sim5}=0$, $V_{WL6}=c_6$, $V_{WL7}=0$, $V_{BL0\sim7}=X_{0\sim7}$ and $V_{SL0\sim7}=\overline{X_{0\sim7}}$ to calculate $s_6$ and store $s_6$ in $R_6$ of the 1T1R array $G_3$; when $c_6=0$, $s_6=a_6 \oplus b_6$, and when $c_5=1$, $s_6=\overline{a_6 \oplus b_6}$.

(S5-9) Inputting logic signals $V_{WL0c\sim7c}=0$, $V_{WL8c}=1$, $V_{BL0c\sim8c}=a_7$ and $V_{SL0c\sim8c}=\overline{b_7}$ to calculate $c_8=a_7 \cdot b_7+a_7 \cdot c_7+c_7 \cdot b_7$ and store $c_8$ in $R_{8c}$ of the 1T1R array $G_2$; inputting logic signals $V_{WL0\sim6}=0$, $V_{WL7}=c_7$, $V_{BL0\sim7}=X_{0\sim7}$ and $V_{SL0\sim7}=\overline{X_{0\sim7}}$ to calculate $s_7$ and store $s_7$ in $R_7$ of the 1T1R array $G_3$; when $c_7=0$, $s_7=a_7 \oplus b_7$, and when $c_7=1$, $s_7=\overline{a_7 \oplus b_7}$.

Figure 9:
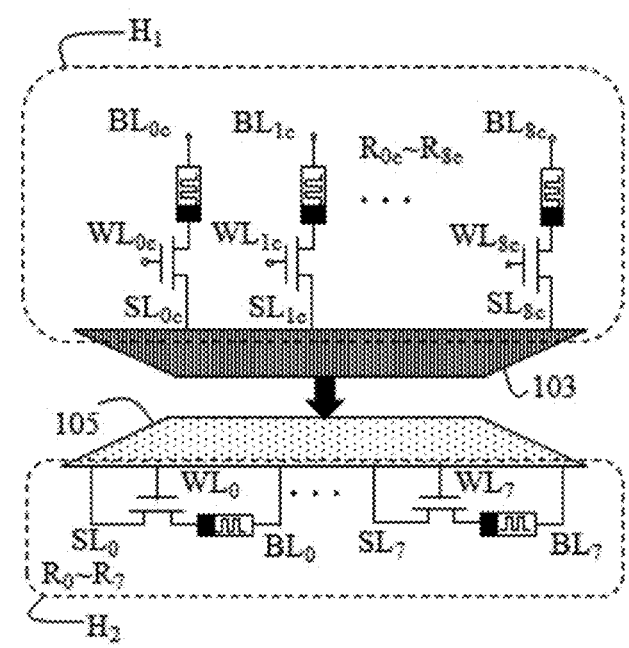
FIG. 9 is an equivalent circuit diagram of an operation circuit of an 8-bit pre-calculation adder based on the computing array according to an embodiment of the present invention.

FIG. 9 shows an operation circuit based on the computing array according to the present invention for implementing an 8-bit pre-calculation adder, in which sums $s_{0\sim7}$ and carry information $c_8$ are calculated according to input data $a_{0\sim7}$ and $b_{0\sim7}$ and carry information $c_0$; the operation circuit includes a 1T1R array $H_1$ and a 1T1R array $H_2$; the 1T1R array $H_1$ includes nine 1T1R devices $R_{0c}\sim R_{8c}$ for calculating carry data $c_i$ (i is an integer from 0 to 8), word line control signals corresponding to $R_{0c}\sim R_{8c}$ are respectively $V_{WL0c}\sim V_{WL8c}$, bit line control signals corresponding to $R_{0c}\sim R_{8c}$ are respectively $V_{BL0c}\sim V_{BL8c}$, and source line control signals corresponding to $R_{0c}\sim R_{8c}$ are respectively $V_{SL0c}\sim V_{SL8c}$; the 1T1R array $H_2$ includes eight 1T1R devices $R_0\sim R_7$ for calculating and storing addition operation results $s_{0\sim7}$, word line control signals corresponding to $R_0\sim R_7$ are respectively $V_{WL0}\sim V_{WL7}$, bit line control signals corresponding to $R_0\sim R_7$ are respectively $V_{BL0}\sim V_{BL7}$, and source line control signals corresponding to $R_0\sim R_7$ are respectively $V_{SL0}\sim V_{SL7}$; and the carry information $c_1$ calculated by the 1T1R array $H_1$ is converted by the signal amplifier and the control signal modem, and then transmitted to the 1T1R array $H_2$ through the data transmission circuit.

In conjunction with the operation circuit based on the computing array shown in FIG. 9, an operating method according to the present invention comprises the following steps.

(S6-1) Inputting logic signals $V_{WL0c\sim8c}=1$, $V_{BL0c\sim8c}=c_0$ and $V_{SL0c\sim8c}=\overline{c_0}$ to store $c_0$ in $R_{0c}\sim R_{8c}$ of the 1T1R array $H_1$; inputting logic signals $V_{WL0\sim7}=1$, $V_{BL0\sim7}=c_0$ and $V_{SL0\sim7}=\overline{c_0}$ to store the input carry information $c_0$ in $R_0\sim R_7$ of the 1T1R array $H_2$.

(S6-2) Inputting logic signals $V_{WL0c}=0$, $V_{WL1c\sim8c}=1$, $V_{BL0c\sim8c}=a_0$ and $V_{SL0c\sim8c}=\overline{b_0}$ to calculate $c_1=a_0 \cdot b_0+a_0 \cdot c_0+c_0 \cdot b_0$ and store $c_1$ in $R_{1c\sim8c}$ of the 1T1R array $H_1$; inputting logic signals $V_{WL0\sim7}=1$, $V_{BL0\sim7}=a_0$, $V_{SL0}=b_0$ and $V_{SL1\sim7}=\overline{b_0}$ to calculate $s_0'=c_0 \cdot a_0+\overline{c_0} \cdot a_0 \cdot \overline{b_0}+c_0 \cdot \overline{a_0} \cdot \overline{b_0}$ and $c_1=a_0 \cdot b_0+a_0 \cdot c_0+c_0 \cdot b_0$ and store $s_0'$ in $R_0$ of the 1T1R array $H_2$ and $c_1$ in $R_1\sim R_7$ of the 1T1R array $H_2$.

(S6-3) Inputting logic signals $V_{WL0c\sim1c}=0$, $V_{WL2c\sim8c}=1$, $V_{BL0c\sim8c}=a_1$ and $V_{SL0c\sim8c}=\overline{b_1}$ to calculate $c_2=a_1 \cdot b_1+a_1 \cdot c_1+c_1 \cdot b_1$ and store $c_2$ in $R_{2c\sim8c}$ of the 1T1R array $H_1$; inputting logic signals $V_{WL0\sim7}=1$, $V_{BL0}=b_0$, $V_{BL1\sim7}=a_1$, $V_{SL0}=c_1$, $V_{SL1}=b_1$ and $V_{SL2\sim7}=\overline{b_1}$ to calculate $s_0=a_0 \oplus b_0 \oplus c_0$, $s_1=c_1 \cdot a_1+\overline{c_1} \cdot a_1 \cdot \overline{b_1}+c_1 \cdot \overline{a_1} \cdot \overline{b_1}$ and $c_2$ and store $s_0$ in $R_0$ of the 1T1R array $H_2$, $s_1'$ in $R_1$ of the 1T1R array $H_2$ and $c_2$ in $R_2\sim R_7$ of the 1T1R array $H_2$.

(S6-4) Inputting logic signals $V_{WL0c\sim2c}=0$, $V_{WL3c\sim8c}=1$, $V_{BL0c\sim8c}=a_2$ and $V_{SL0c\sim8c}=\overline{b_2}$ to calculate $c_3=a_2 \cdot b_2+a_2 c_2+c_2 \cdot b_2$ and store $c_3$ in $R_{3c\sim8c}$ of the 1T1R array $H_1$; inputting logic signals $V_{WL0}=0$, $V_{WL1\sim7}=1$, $V_{BL0}=0$, $V_{BL1}=b_1$, $V_{BL2\sim7}=a_2$, $V_{SL0}=0$, $V_{SL1}=c_2$, $V_{SL2}=b_2$ and $V_{SL3\sim7}=\overline{b_2}$ to calculate $s_1=a_1 \oplus b_1 \oplus c_1$, $s_2=c_2 \cdot a_2+\overline{c_2} \cdot a_2 \cdot \overline{b_2}+c_2 \cdot \overline{a_2} \cdot \overline{b_2}$ and $c_3=a_2 \cdot b_2+a_2 \cdot c_2+c_2 \cdot b_2$ and store $s_1$ in $R_1$ of the 1T1R array $H_2$, $s_2$ in $R_2$ of the 1T1R array $H_2$ and $c_3$ in $R_3\sim R_7$ of the 1T1R array $H_2$.

(S6-5) Inputting logic signals $V_{WL0c\sim3c}=0$, $V_{WL4c\sim8c}=1$, $V_{BL0c\sim8c}=a_3$ and $V_{SL0c\sim8c}=\overline{b_3}$ to calculate $c_4=a_3 \cdot b_3+a_3 \cdot c_3+c_3 \cdot b_3$ and store $c_4$ in $R_{4c\sim8c}$ of the 1T1R array $H_1$; inputting logic signals $V_{WL0\sim1}=0$, $V_{WL2\sim7}=1$, $V_{BL0\sim1}=0$, $V_{BL2}=b_2$, $V_{BL3\sim7}=a_3$, $V_{SL0\sim1}=0$, $V_{SL2}=c_3$, $V_{SL3}=b_3$ and $V_{SL4\sim7}=\overline{b_3}$ to calculate $s_2=a_2 \oplus b_2 \oplus c_2$, $s_3'=c_3 \cdot a_3+\overline{c_3} \cdot a_3 \cdot \overline{b_3}+c_3 \cdot \overline{a_3} \cdot \overline{b_3}$ and $c_4$, and store $s_2$ in $R_2$ of the 1T1R array $H_2$, $s_3'$ in $R_3$ of the 1T1R array $H_2$ and $c_4$ in $R_4\sim R_7$ of the 1T1R array $H_2$.

(S6-6) Inputting logic signals $V_{WL0c\sim4c}=0$, $V_{WL5c\sim8c}=1$, $V_{BL0c\sim8c}=a_4$ and $V_{SL0c\sim8c}=\overline{b_4}$ to calculate $c_5=a_4 \cdot b_4+a_4 \cdot c_4+c_4 \cdot b_4$ and store $c_5$ in $R_{5c\sim8c}$ of the 1T1R array $H_1$; inputting logic signals $V_{WL0\sim2}=0$, $V_{WL3\sim7}=1$, $V_{BL0\sim2}=0$, $V_{BL3}=b_3$, $V_{BL4\sim7}=a_4$, $V_{SL0\sim2}=0$, $V_{SL3}=c_4$, $V_{SL4}=b_4$ and $V_{SL5\sim7}=\overline{b_4}$ to calculate $s_3=a_3 \oplus b_3 \oplus c_3$, $s_4'=c_4 \cdot a_4+\overline{c_4} \cdot a_4 \cdot \overline{b_4}+c_4 \cdot \overline{a_4} \cdot \overline{b_4}$ and $c_5$, and store $s_3$ in $R_3$ of the 1T1R array $H_2$, $s_4'$ in $R_4$ of the 1T1R array $H_2$ and $c_5$ in $R_5\sim R_7$ of the 1T1R array $H_2$.

(S6-7) Inputting logic signals $V_{WL0c\sim5c}=0$, $V_{WL6c\sim8c}=1$, $V_{BL0c\sim8c}=a_5$ and $V_{SL0c\sim8c}=\overline{b_5}$ to calculate $c_6=a_5 \cdot b_5+a_5 \cdot c_5+c_5 \cdot b_5$ and store $c_6$ in $R_{6c\sim8c}$ of the 1T1R array $H_1$; inputting logic signals $V_{WL0\sim3}=0$, $V_{WL4\sim7}=1$, $V_{BL0\sim3}=0$, $V_{BL4}=b_4$, $V_{BL5\sim7}=a_5$, $V_{SL0\sim3}=0$, $V_{SL4}=c_5$, $V_{SL5}=b_5$ and $V_{SL6\sim7}=\overline{b_5}$ to calculate $s_4=a_4 \oplus b_4 \oplus c_4$, $s_5'=c_5 \cdot a_5+\overline{c_5} \cdot a_5 \cdot \overline{b_5}+c_5 \cdot \overline{a_5} \cdot \overline{b_5}$ and $c_6$, and store $s_4$ in $R_4$ of the 1T1R array $H_2$, $s_5'$ in $R_5$ of the 1T1R array $H_2$ and $c_6$ in $R_6\sim R_7$ of the 1T1R array $H_2$.

(S6-8) Inputting logic signals $V_{WL0c\sim6c}=0$, $V_{WL7c\sim8c}=1$, $V_{BL0c\sim8c}=a_6$ and $V_{SL0c\sim8c}=\overline{b_6}$ to calculate $c_7=a_6 \cdot b_6+a_6 \cdot c_6+c_6 \cdot b_6$ and store $c_7$ in $R_{7c\sim8c}$ of the 1T1R array $H_1$; inputting logic signals $V_{WL0\sim4}=0$, $V_{WL5\sim7}=1$, $V_{BL0\sim4}=0$, $V_{BL5}=b_5$, $V_{BL6\sim7}=a_6$, $V_{SL0\sim4}=0$, $V_{SL5}=c_6$, $V_{SL6}=b_6$ and $V_{SL7}=\overline{b_6}$ to calculate $s_5=a_5 \oplus b_5 \oplus c_5$, $s_6'=c_6 \cdot a_6+\overline{c_6} \cdot a_6 \cdot \overline{b_6}+c_6 \cdot \overline{a_6} \cdot \overline{b_6}$ and $c_7$, and store $s_5$ in $R_5$ of the 1T1R array $H_2$, $s_6'$ in $R_6$ of the 1T1R array $H_2$ and $c_7$ in $R_7$ of the 1T1R array $H_2$.

(S6-9) Inputting logic signals $V_{WL0c\sim7c}=0$, $V_{WL8c}=1$, $V_{BL0c\sim8c}=a_7$ and $V_{SL0c\sim8c}=\overline{b_7}$ to calculate $c_8=a_7 \cdot b_7+a_7 \cdot c_7+c_7 \cdot b_7$ and store $c_8$ in $R_{8c}$ of the 1T1R array $H_1$; inputting logic signals $V_{WL0\sim5}=0$, $V_{WL6\sim7}=1$, $V_{BL0\sim5}=0$, $V_{BL6}=b_6$, $V_{BL7}=a_7$, $V_{SL0\sim5}=0$, $V_{SL6}=c_7$ and $V_{SL7}=\overline{b_7}$ to calculate $s_6=a_6 \oplus b_6 \oplus c_6$ and $s_7'=c_7 \cdot a_7+\overline{c_7} \cdot a_7 \cdot \overline{b_7}+c_7 \cdot \overline{a_7} \cdot \overline{b_7}$, and store $s_6$ in $R_6$ of the 1T1R array $H_2$ and $s_7'$ in $R_7$ of the 1T1R array $H_2$.

(S6-10) Inputting logic signals $V_{WL0\sim6}=0$, $V_{WL7}=1$, $V_{BL0\sim6}=0$, $V_{BL7}=b_7$, $V_{SL0\sim6}=0$ and $V_{SL7}=c_8$, and inputting a logic signal of 0 to each of other terminals to calculate $s_7=a_7 \oplus b_7 \oplus c_7$ and store $s_7$ in $R_7$ of the 1T1R array $H_2$.

It should be readily understood to those skilled in the art that the above description is only preferred embodiments of the present invention, and does not limit the scope of the present invention. Any change, equivalent substitution and modification made without departing from the spirit and scope of the present invention should be included within the scope of the protection of the present invention.

What is claimed is:

1. A computing array based on 1T1R device, comprising: one or more 1T1R arrays and a peripheral circuit; the 1T1R array is configured to achieve operation and storage of an operation result, and the peripheral circuit is configured to transmit data and control signals to control operation and storage processes of the 1T1R arrays, wherein 16 basic Boolean logic operations are implemented by controlling initial resistance states of the 1T1R devices, word line input signals, bit line input signals and source line input signals;

a logic signal stored in the 1T1R device is read by inputting a logic signal $V_{WL}=1$ via a word line, a logic signal $V_{BL}=V_{read}$ via a bit line and a logic signal $V_{SL}=0$ via a source line; $V_{read}$ is a voltage pulse signal applied when a resistance state of the 1T1R device is read.

2. The computing array based on 1T1R device according to claim 1, wherein the 1T1R array includes 1T1R devices arranged in an array, word lines WL, bit lines BL and source lines SL; resistance states of the 1T1R devices include: High Resistance H and Low Resistance L; the 1T1R devices realize storage and processing of information through different resistance states; and the 1T1R devices in the same row are connected to the same word line, the 1T1R devices in the same column are connected to the same bit line and source line, and through applying different signals to the word lines WL, the bit lines BL and the source lines SL, different operations are achieved and operation results are stored.

3. The computing array based on 1T1R device according to claim 2, wherein the 1T1R device includes a transistor and a resistive element; the transistor includes a substrate, a source, a drain, an insulating layer and a gate, in which the source is connected to the source line SL, and the gate is connected to the word line WL; the resistive element includes two end electrodes, one of which is connected to the bit line BL and the other of which is connected to the drain of the transistor; and the resistive element has a stacked structure with a nonvolatile resistance transition characteristic.

4. The computing array based on 1T1R device according to claim 2, wherein the peripheral circuit includes: a state controller, a word line decoder, a source line decoder, a bit line decoder, a signal amplifier, a control signal modem and a data transmission circuit;

the state controller has a data input/output terminal Data, an address input terminal Address, a clock signal input terminal CLK, a result input terminal, a word line output terminal, a bit line output terminal, a source line output terminal and a secondary output terminal; the data input/output terminal Data of the state controller is configured to input calculated data on the one hand and output a calculated result on the other hand, the address input terminal Address of the state controller is configured to input address information of a selected device, the clock signal input terminal CLK of the state controller is configured to input a clock signal for controlling a calculation timing, and the result input terminal of the state controller is configured to input a calculated result generated by a pre-stage circuit; the state controller generates a control signal according to the input data, address information, clock signal and calculated result, or outputs a final calculated result;

an input terminal of the word line decoder is connected to the word line output terminal of the state controller, an output terminal of the word line decoder is connected to the word line of the 1T1R array; the word line decoder decodes the control signal generated by the state controller to obtain a word line control signal, and inputs the word line control signal to the 1T1R devices through the word line of the 1T1R array;

an input terminal of the bit line decoder is connected to the bit line output terminal of the state controller, an output terminal of the bit line decoder is connected to the bit line of the 1T1R array; the bit line decoder decodes the control signal generated by the state controller to obtain a bit line control signal, and inputs the bit line control signal to the 1T1R devices through the bit line of the 1T1R array;

an input terminal of the source line decoder is connected to the source line output terminal of the state controller, an output terminal of the source line decoder is connected to the source line of the 1T1R array; the source line decoder decodes the control signal generated by the state controller to obtain a source line control signal, and inputs the source line control signal to the 1T1R devices through the source line of the 1T1R array;

the word line control signal, the bit line control signal and the source line control signal are commonly applied to the 1T1R array to control states of the 1T1R devices in the 1T1R array;

an input terminal of the signal amplifier is connected to a bit line of the 1T1R array; when data information stored in the 1T1R array is read, the signal amplifier converts an acquired resistance signal stored by the 1T1R device into a voltage signal and then outputs it to the control signal modern;

a first input terminal of the control signal modern is connected to the secondary output terminal of the state controller, a second input terminal of the control signal modem is connected to an output terminal of the signal amplifier; the control signal modem decodes the control signal generated by the state controller to obtain a control signal of a next-stage circuit, or directly transmits the data voltage signal output by the signal amplifier; the next-stage circuit is the next 1T1R device in the same 1T1R array, or a next 1T1R array in the compute array;

an input terminal of the data transmission circuit is connected to an output terminal of the control signal modem; the data transmission circuit feeds back the data voltage signal output by the control signal modem to the state controller through the result input terminal of the state controller, or transmits the control signal output from the control signal modem to the word line decoder, the bit line decoder and the source line decoder of the next-stage circuit.

5. The computing array based on 1T1R device according to claim 3, wherein the peripheral circuit includes: a state controller, a word line decoder, a source line decoder, a bit line decoder, a signal amplifier, a control signal modem and a data transmission circuit;

the state controller has a data input/output terminal Data, an address input terminal Address, a clock signal input terminal CLK, a result input terminal, a word line output terminal, a bit line output terminal, a source line output terminal and a secondary output terminal; the data input/output terminal Data of the state controller is configured to input calculated data on the one hand and output a calculated result on the other hand, the address input terminal Address of the state controller is configured to input address information of a selected device, the clock signal input terminal CLK of the state controller is configured to input a clock signal for controlling a calculation timing, and the result input terminal of the state controller is configured to input a calculated result generated by a pre-stage circuit; the state controller generates a control signal according to the input data, address information, clock signal and calculated result, or outputs a final calculated result;

an input terminal of the word line decoder is connected to the word line output terminal of the state controller, an output terminal of the word line decoder is connected to the word line of the 1T1R array; the word line decoder decodes the control signal generated by the state controller to obtain a word line control signal, and inputs the word line control signal to the 1T1R devices through the word line of the 1T1R array;

an input terminal of the bit line decoder is connected to the bit line output terminal of the state controller, an output terminal of the bit line decoder is connected to the bit line of the 1T1R array; the bit line decoder decodes the control signal generated by the state controller to obtain a bit line control signal, and inputs the bit line control signal to the 1T1R devices through the bit line of the 1T1R array;

an input terminal of the source line decoder is connected to the source line output terminal of the state controller, an output terminal of the source line decoder is connected to the source line of the 1T1R array; the source line decoder decodes the control signal generated by the state controller to obtain a source line control signal, and inputs the source line control signal to the 1T1R devices through the source line of the 1T1R array;

the word line control signal, the bit line control signal and the source line control signal are commonly applied to the 1T1R array to control states of the 1T1R devices in the 1T1R array;

an input terminal of the signal amplifier is connected to a bit line of the 1T1R array; when data information stored in the 1T1R array is read, the signal amplifier converts an acquired resistance signal stored by the 1T1R device into a voltage signal and then outputs it to the control signal modem;

a first input terminal of the control signal modem is connected to the secondary output terminal of the state controller, a second input terminal of the control signal modem is connected to an output terminal of the signal amplifier; the control signal modem decodes the control signal generated by the state controller to obtain a control signal of a next-stage circuit, or directly transmits the data voltage signal output by the signal amplifier; the next-stage circuit is the next 1T1R device in the same 1T1R array, or a next 1T1R array in the compute array;

an input terminal of the data transmission circuit is connected to an output terminal of the control signal modem; the data transmission circuit feeds back the data voltage signal output by the control signal modem to the state controller through the result input terminal of the state controller, or transmits the control signal output from the control signal modem to the word line decoder, the bit line decoder and the source line decoder of the next-stage circuit.

6. The computing array based on 1T1R device according to claim 1, wherein the peripheral circuit includes: a state controller, a word line decoder, a source line decoder, a bit line decoder, a signal amplifier, a control signal modem and a data transmission circuit;

the state controller has a data input/output terminal Data, an address input terminal Address, a clock signal input terminal CLK, a result input terminal, a word line output terminal, a bit line output terminal, a source line output terminal and a secondary output terminal; the data input/output terminal Data of the state controller is configured to input calculated data on the one hand and output a calculated result on the other hand, the address input terminal Address of the state controller is configured to input address information of a selected device, the clock signal input terminal CLK of the state controller is configured to input a clock signal for controlling a calculation timing, and the result input terminal of the state controller is configured to input a calculated result generated by a pre-stage circuit; the state controller generates a control signal according to the input data, address information, clock signal and calculated result, or outputs a final calculated result;

an input terminal of the word line decoder is connected to the word line output terminal of the state controller, an output terminal of the word line decoder is connected to the word line of the 1T1R array; the word line decoder decodes the control signal generated by the state controller to obtain a word line control signal, and inputs the word line control signal to the 1T1R devices through the word line of the 1T1R array;

an input terminal of the bit line decoder is connected to the bit line output terminal of the state controller, an output terminal of the bit line decoder is connected to the bit line of the 1T1R array; the bit line decoder decodes the control signal generated by the state controller to obtain a bit line control signal, and inputs the bit line control signal to the 1T1R devices through the bit line of the 1T1R array;

an input terminal of the source line decoder is connected to the source line output terminal of the state controller, an output terminal of the source line decoder is connected to the source line of the 1T1R array; the source line decoder decodes the control signal generated by the state controller to obtain a source line control signal, and inputs the source line control signal to the 1T1R devices through the source line of the 1T1R array;

the word line control signal, the bit line control signal and the source line control signal are commonly applied to the 1T1R array to control states of the 1T1R devices in the 1T1R array;

an input terminal of the signal amplifier is connected to a bit line of the 1T1R array; when data information stored in the 1T1R array is read, the signal amplifier converts an acquired resistance signal stored by the 1T1R device into a voltage signal and then outputs it to the control signal modem;

a first input terminal of the control signal modem is connected to the secondary output terminal of the state controller, a second input terminal of the control signal modem is connected to an output terminal of the signal amplifier; the control signal modem decodes the control signal generated by the state controller to obtain a control signal of a next-stage circuit, or directly transmits the data voltage signal output by the signal amplifier; the next-stage circuit is the next 1T1R device in the same 1T1R array, or a next 1T1R array in the compute array;

an input terminal of the data transmission circuit is connected to an output terminal of the control signal modem; the data transmission circuit feeds back the data voltage signal output by the control signal modem to the state controller through the result input terminal of the state controller, or transmits the control signal output from the control signal modem to the word line decoder, the bit line decoder and the source line decoder of the next-stage circuit.

7. The computing array based on 1T1R device according to claim 6, wherein the data input/output terminal Data, the address input terminal Address and the clock signal input terminal CLK of the state controller respectively serve as a data input/output terminal, an address input terminal and a clock signal input terminal of the computing array.

8. An operation circuit based on the computing array according to claim 6 for implementing a 1-bit full adder, in which a sum $s_0$ and a high-order carry $c_1$ are calculated according to a logic signal a, a logic signal b and a low-order carry $c_0$ that are input, comprising: a 1T1R array $A_1$, a 1T1R array $A_2$ and a 1T1R array $A_3$; the 1T1R array $A_1$ includes a 1T1R device $R_b$ for calculating and storing intermediate data $s_0^*$, a word line signal corresponding to $R_b$ is $V_{WLb}$, a bit line signal corresponding to $R_b$ is $V_{BLb}$ and a source line signal corresponding to $R_b$ is $V_{SLb}$; the 1T1R array $A_2$ includes a 1T1R device $R_c$ for calculating and storing the high-order carry $c_1$, a word line signal corresponding to $R_c$ is $V_{WLc}$, a bit line signal corresponding to R, is $V_{BLc}$, and a source line signal corresponding to $R_c$ is $V_{SLc}$; the 1T1R array $A_3$ includes a 1T1R device $R_s$ for calculating and storing the sum $s_0$, a word line signal corresponding to $R_s$ is $V_{WLs}$, a bit line signal corresponding to $R_s$ is $V_{BLs}$ and a source line signal corresponding to $R_s$ is $V_{SLs}$; and the intermediate data $s_0^*$ calculated by the 1T1R array $A_1$ and the high-order carry $c_1$ calculated by the 1T1R array $A_2$ are converted by the signal amplifier and the control signal modem, and then transmitted to the 1T1R array $A_3$ through the data transmission circuit.

9. An operating method based on the operation circuit according to claim 8, comprising:
(S1-1) inputting logic signals $V_{WLc}=1$, $V_{BLc}=c_0$ and $V_{SLc}=\overline{c_0}$ to write the input logic signal $c_0$ into $R_c$ of the 1T1R array $A_2$; inputting logic signals $V_{WLb}=1$, $V_{BLb}=a_0$ and $V_{SLb}=\overline{a_0}$ to write the input logic signal $a_0$ into $R_b$ of the 1T1R array $A_1$; inputting logic signals $V_{WLs}=1$, $V_{BLs}=a_0$ and $V_{SLs}=\overline{a_0}$ to write the input logic signal $a_0$ into $R_s$ of the 1T1R array $A_3$;
(S1-2) inputting logic signals $V_{WLc}=1$, $V_{BLc}=a_0$ and $V_{SLc}=\overline{b_0}$ to calculate a high-order carry $c_1=a_0 \cdot b_0 + a_0 \cdot c_0 + c_0 \cdot b_0$ and store $c_1$ in $R_c$ of the 1T1R array $A_2$; inputting logic signals $V_{WLb}=b_0$, $V_{Blb}=\overline{a_0}$ and $V_{SLb}=a_0$ to calculate an intermediate result $s_0^*=a_0 \oplus b_0$ and store $s_0^*$ in $R_b$ of the 1T1R array $A_1$; inputting logic signals $V_{WLs}=b_0$, $V_{BLs}=\overline{a_0}$ and $V_{SLs}=a_0$ to calculate an intermediate result $s_0^*$ and store $s_0^*$ in $R_s$ of the 1T1R array $A_3$;
(S1-3) reading the logic signal $c_1$ stored in $R_c$ of the 1T1R array $A_2$; reading the logic signal $s_0^*$ stored in $R_b$ of the 1T1R array $A_1$; inputting logic signals $V_{WLs}=c_0$, $V_{BLs}=\overline{s_0^*}$ and $V_{SLs}=s_0^*$ to calculate a sum $s_0=a_0 \oplus b_0 \oplus c_0$ and store $s_0$ in $R_s$ of the 1T1R array $A_3$; and
(S1-4) reading the logic signal $s_0$ stored in $R_s$ of the 1T1R array $A_3$.

10. An operation circuit based on the computing array according to claim 6 for implementing a multi-bit step-by-step carry adder, in which sums $s_{0\sim n-1}$ and carry information $c_n$ are calculated according to input data $a_{0\sim n-1}$ and $b_{0\sim n-1}$ and carry information $c_0$, and n represents the number of bits of the operation data, comprising: a 1T1R array $D_1$, a 1T1R array $D_2$ and a 1T1R array $D_3$; the 1T1R array $D_1$ includes n 1T1R devices $R_{0b}\sim R_{(n-1)b}$ for calculating and storing intermediate results $s_{0\sim n-1}^*$, word line control signals corresponding to $R_{0b}\sim R_{(n-1)b}$ are respectively $V_{WL0b}\sim V_{WL(n-1)b}$, bit line control signals corresponding to $R_{0b}\sim R_{(n-1)b}$ are respectively $V_{BL(n-1)b}$ and source line control signals corresponding to $R_{0b}\sim R_{(n-1)b}$ are respectively $V_{sL0b}\sim V_{SL(n-1)b}$; the 1T1R array $D_1$ is used for data backup; the 1T1R array $D_2$ includes a 1T1R device $R_n$ for calculating and storing carry data $c_i$, i is an integer from 0 to 8, a word line control signal corresponding to $R_n$ is $V_{WLn}$, a bit line control signal corresponding to $R_n$ is $V_{BLn}$ and a source line control signal corresponding to $R_n$ is $V_{SLn}$; the 1T1R array $D_3$ includes n 1T1R devices $R_0\sim R_{n-1}$ for calculating and storing addition operation results $s_{0\sim n-1}$, word line control signals corresponding to $R_0\sim R_{n-1}$ are respectively $V_{WL0}\sim V_{WL(n-1)}$, bit line control signals corresponding to $R_0\sim R_{n-1}$ are respectively $V_{BL0}\sim V_{BL(n-1)}$, and source line control signals corresponding to $R_0\sim R_{n-1}$ are respectively $V_{sL0}\sim V_{SL(n-1)}$; and the intermediate data $s_{0\sim n-1}^*$ calculated by the 1T1R array $D_1$ and the carry information $c_i$ calculated by the 1T1R array $D_2$ are converted by the signal amplifier and the control signal modem, and then transmitted to the 1T1R array $D_3$ through the data transmission circuit.

11. An operating method based on the operation circuit according to claim 9, comprising:
(S2-1) inputting logic signals $V_{WL0\sim(n-1)}=1$, $V_{BL0\sim(n-1)}=a_{0\sim n-1}$ and $V_{SL0\sim(n-1)}=\overline{a_{0\sim n-1}}$ to write the input data $a_{0\sim n-1}$ into $R_{0\sim n-1}$ of the 1T1R array $D_3$; inputting logic signals $V_{WLn}=1$, $V_{BLn}=c_0$ and $V_{SLn}=\overline{c_0}$ to write the carry information $c_0$ into $R_n$ of the 1T1R array $D_2$, a word line input signal, a bit line input signal and a source line input signal of the 1T1R array $D_1$ being the same as that of the 1T1R array $D_3$;
(S2-2) inputting logic signals $V_{WL0\sim(n-1)}=b_{0\sim n-1}$, $V_{BL0\sim(n-1)}=\overline{a_{0\sim n-1}}$ and $V_{SL0\sim(n-1)}=a_{0\sim n-1}$ to calculate intermediate results $s_{0\sim n-1}^*=a_{0\sim n-1}\oplus b_{0\sim n-1}$ and store $s_{0\sim n-1}^*$, in $R_{0\sim n-1}$ of the 1T1R array $D_3$; inputting logic signals $V_{WL0b\sim(n-1)b}=b_{0\sim n-1}$, $V_{BL0b\sim(n-1)b}=\overline{a_{0\sim n-1}}$ and $V_{SL0b\sim(n-1)b}=a_{0\sim n-1}$ to calculate intermediate results $s_{0\sim n-1}^*$ and store $s_{0\sim n-1}^*$ in $R_{0b\sim(n-1)b}$ of the 1T1R array $D_1$; inputting logic signals $V_{WLn\sim}=1$, $V_{BLn}=a_0$ and $V_{SLn}=\overline{b_0}$ to calculate $c_1=a_0 \cdot b_0 + a_0 \cdot c_0 + c_0 \cdot b_0$ and store $c_1$ in $R_n$ of the 1T1R array $D_2$;
(S2-3) reading $s_0^*$ from $R_{0b}$ of the 1T1R array $D_1$, and reading $s_1^*$ from $R_{1b}$ of the 1T1R array D1; inputting logic signals $V_{WL0}=c_0$, $V_{WL1}=c_1$, $V_{WL2\sim n-1}=0$, $V_{BL0}=\overline{s_0^*}$, $V_{BL1}=\overline{s_1^*}$, $V_{BL2\sim n-1}=0$, $V_{SL0}=s_0^*$, $V_{SL1}=s_1^*$ and $V_{SL2\sim n-1}=0$ to calculate $s_0=a_0 \oplus b_0 \oplus c_0$ and $s_1=a_1 \oplus b_1 \oplus c_1$, and store $s_0$ in $R_0$ of the 1T1R array $D_3$ and $s_1$ in $R_1$ of the 1T1R array $D_3$;
(S2-4) denoting the i-th bit in the operation data or operation result by i, and giving i an initial value of i=2;
(S2-5) inputting logic signals $V_{WLn}=1$, $V_{BLn}=a_{i-1}$ and $V_{SLn}=\overline{b_{i-1}}$, to calculate $c_i=a_{i-1} \cdot b_{i-1} + a_{i-1} \cdot c_{i-1} + c_{i-1} \cdot b_{i-1}$ and store $c_i$ in $R_n$ of the 1T1R array $D_2$;
(S2-6) reading from $R_{ib}$ of the 1T1R array $D_1$; inputting logic signals $V_{WL0\sim(i-1)}=0$, $V_{WLi}=c_i$, $V_{WL(i+1)\sim(n-1)}=0$, $V_{BL0\sim(i-1)}=0$, $V_{BLi}=\overline{s_i^*}$, $V_{BL(i+1)\sim(n-1)}=0$, $V_{SL0\sim(i-1)}=0$, $V_{SLi}=s_i^*$ and $V_{SL(i+1)\sim(n-1)}=0$ to calculate $s_i=a_i \oplus b_i \oplus c_i$ and store $s_i$ in $R_i$ of the 1T1R array $D_3$;
(S2-7) incrementing the value of i by 1, and if i<n-1, proceeding to the step (S2-5); otherwise, proceeding to step (S2-8);
(S2-8) inputting logic signals $V_{WLn}=1$, $V_{BLn}=a_{n-2}$ and $V_{SLn}=\overline{b_{n-2}}$ to calculate $c_{n-1}=a_{n-2} \cdot b_{n-2} + a_{n-2} \cdot c_{n-2} + c_{n-2} \cdot b_{n-2}$ and store $c_{n-1}$ in R of the 1T1R array $D_2$;
(S2-9) reading $s_{n-1}^*$ from $R_{(n-1)b}$ of the 1T1R array $D_1$; inputting logic signals $V_{WL0\sim(n-2)}=0$, $V_{WL(n-1)}=c_{n-1}$, $V_{BL0\sim(n-2)}=0$, $V_{BL(n-1)}=\overline{s_{n-1}}^*$, $V_{SL0\sim(n-2)}=0$, and $V_{SL(n-1)}=s_{n-1}^*$ to calculate $s_{n-1}=a_{n-1}\oplus b_{n-1}\oplus c_{n-1}$ and store $s_{n-1}$ in $R_{n-1}$ of the 1T1R array $D_3$; and (S2-10) inputting logic signals $V_{WLn}=1$, $V_{BLn}=a_{n-1}$ and $V_{SLn}=\overline{b_{n-1}}$ to calculate $c_n=a_{n-1}\cdot b_{n-1}+a_{n-1}\cdot c_{n-1}+c_{n-1}\cdot b_{n-1}$ and store $c_n$ in $R_n$ of the 1T1R array $D_2$.

12. An operation circuit based on the computing array according to claim 6 for implementing an optimized multi-bit step-by-step carry adder, in which sums $s_{0\sim n-1}$ and carry information $c_n$ are calculated according to input data $a_{0\sim n-1}$ and $b_{0\sim n-1}$ and carry information $c_0$, and n represents the number of bits of the operation data, comprising: a 1T1R array $E_1$, a 1T1R array $E_2$ and a 1T1R array $E_3$; the 1T1R array $E_1$ includes n 1T1R devices $R_{0b}\sim R_{(n-1)b}$ for calculating and storing data $s_{0\sim n-1}^*$, word line control signals corresponding to $R_{0b}\sim R_{(n-1)b}$ are respectively $V_{WL0b}\sim V_{WL(n-1)b}$, bit line control signals corresponding to $R_{0b}\sim R_{(n-1)b}$ are respectively $V_{BL0b}\sim V_{BL(n-1)b}$, and source line control signals corresponding to $R_{0b}\sim R_{(n-1)b}$ are respectively $V_{SL0b}\sim V_{SL(n-1)b}$; the 1T1R array $E_1$ is used for data backup; the 1T1R array $E_2$ includes (n+1) 1T1R devices $R_{0c}\sim R_{nc}$ for calculating and storing carry data $c_i$, i is an integer from 0 to n, word line control signals corresponding to $R_{0c}\sim R_{nc}$ are respectively $V_{WL0c}\sim V_{WLnc}$, bit line control signals corresponding to $R_{0c}\sim R_{nc}$ are respectively $V_{BL0c}\sim V_{BLnc}$, and source line control signals corresponding to $R_{0c}\sim R_{nc}$ are respectively $V_{SL0c}\sim V_{SLnc}$; the 1T1R array $E_3$ includes n 1T1R devices $R_0\sim R_{n-1}$ for calculating and storing addition operation results $s_{0\sim n-1}$, word line control signals corresponding to $R_0\sim R_{n-1}$ are respectively $V_{WL0}\sim V_{WL(n-1)}$, bit line control signals corresponding to $R_0\sim R_{n-1}$ are respectively $V_{BL0}\sim V_{BL(n-1)}$, and source line control signals corresponding to $R_0\sim R_{n-1}$ are respectively $V_{SL0}\sim V_{SL(n-1)}$; and the intermediate data $s_{0\sim n-1}^*$ calculated by the 1T1R array $E_1$ and the carry information $c_i$ calculated by the 1T1R array $E_2$ are converted by the signal amplifier and the control signal modem, and then transmitted to the 1T1R array $E_3$ through the data transmission circuit.

13. An operating method based on the operation circuit according to claim 12, comprising:

(S3-1) inputting logic signals $V_{WL0\sim(n-1)}=1$, $V_{BL0\sim(n-1)}=a_{0\sim n-1}$ and $V_{SL0\sim(n-1)}=\overline{a_{0\sim n-1}}$ to write the input operational data $a_{0\sim n-1}$ into $R_{0\sim n-1}$ of the 1T1R array $E_3$; inputting logic signals $V_{WL0b\sim(n-1)b}=1$, $V_{BL0b\sim(n-1)b}=a_{0\sim n-1}$ and $V_{SL0b\sim(n-1)b}=\overline{a_{0\sim n-1}}$ to write the input operational data $a_{0\sim n-1}$ into $R_{0b\sim(n-1)b}$ of the 1T1R array $E_1$; inputting logic signals $V_{WL0c\sim nc}=1$, $V_{BL0c\sim nc}=c_0$ and $V_{SL0c\sim nc}=\overline{c_0}$ to write the carry information $c_0$ into $R_{0c\sim nc}$ of the 1T1R array $E_2$;

(S3-2) inputting logic signals $V_{WL0\sim(n-1)}=b_{0\sim n-1}$, $V_{Bl0\sim(n-1)}=\overline{a_{0\sim n-1}}$ and $V_{SL0\sim(n-1)}=a_{0\sim n-1}$ to calculate intermediate results $s_{0\sim n-1}^*=a_{0\sim n-1}\oplus b_{0\sim n-1}$ and store $s_{0\sim n-1}^*$ in $R_{0b\sim(n-1)b}$ of the 1T1R array $E_3$; inputting logic signals $V_{WL0b\sim(n-1)b}=b_{0\sim n-1}$, $V_{BL0b\sim(n-1)b}=\overline{a_{0\sim n-1}}$ and $V_{SL0b\sim(n-1)b}=a_{0\sim n-1}$ to calculate intermediate results $s_{0\sim n-1}^*$ and store $s_{0\sim n-1}^*$ in $R_{0b\sim(n-1)b}$ of the 1T1R array $E_1$; inputting logic signals $V_{WL0c}=0$, $V_{WL1c\sim nc}=1$, $V_{BL0c\sim nc}=a_0$ and $V_{SL0c\sim nc}=\overline{b_0}$ to calculate $c_1=a_0\cdot b_0+a_0\cdot c_0+c_0\cdot b_0$ and store $c_1$ in $R_{1c\sim nc}$ of the 1T1R array $E_2$;

(S3-3) reading $s_0^*$ from $R_{0b}$ of the 1T1R array $E_1$, and reading $s_1^*$ from $R_{1b}$ of the 1T1R array $E1$; inputting logic signals $V_{WL0}=c_0$, $V_{WL1}=c_1$, $V_{WL2\sim(n-1)}=0$, $V_{BL0}=\overline{s_0^*}$, $V_{BL1}=\overline{s_1^*}$, $V_{BL2\sim(n-1)}=0$, $V_{SL0}=s_0^*$, $V_{SL1}=s_1^*$ and $V_{SL2\sim(n-1)}=0$ to calculate $s_0=a_0\oplus b_0\oplus c_0$ and $s_1=a_1\oplus b_1\oplus c_1$ and store $s_0$ in $R_0$ of the 1T1R array $E_3$ and $s_1$ in $R_1$ of the 1T1R array $E_3$; inputting logic signals $V_{WL0c\sim1c}=0$, $V_{WL2c\sim nc}=1$, $V_{BL0c\sim nc}=a_1$ and $V_{SL0c\sim nc}=\overline{b_1}$ to calculate $c_2=a_1\cdot b_1+a_1\cdot c_1+c_1\cdot b_1$, and store $c_2$ of the 1T1R array $E_2$, (S3-4) denoting the i-th bit in the operation data or operation result by i, and giving i an initial value of i=2;

(S3-5) reading $s_i^*$ from $R_{ib}$ of the 1T1R array $E_1$; inputting logic signals $V_{WL0\sim(i-1)}=0$, $V_{WLi}=c_i$, $V_{WL(i+1)\sim(n-1)}=0$, $V_{BL0\sim(i-1)}=0$, $V_{BLi}=\overline{s_i^*}$, $V_{BL(i+1)\sim(n-1)}=0$, $V_{SL0\sim(i-1)}=0$, $V_{SLi}=s_i^*$ and $V_{SL(i+1)\sim(n-1)}=0$ to calculate $s_i=a_i\oplus b_i\oplus c_i$, and store $s_i$ in $R_i$ of the 1T1R array $E_3$; inputting logic signals $V_{WL0c\sim ic}=0$, $V_{WL(i+1)c\sim nc}=1$, $V_{BL0c\sim nc}=a_i$; and $V_{SL0c\sim nc}=\overline{b_i}$ to calculate $c_{i+1}=a_i\cdot b_i+a_i\cdot c_i+c_i\cdot b_i$ and store $c_{i+1}$ in $R_{(i+1)c\sim nc}=1$, of array the 1T1R array $E_2$;

(S3-6) incrementing the value of i by 1, and if i<n-1, proceeding to the step (S3-5); otherwise, proceeding to a step (S3-7); and (3-7) reading $s_{n-1}^*$ from $R_{(n-1)b}$ of the 1T1R array $E_1$; inputting logic signals $V_{WL0\sim(n-2)}=0$, $V_{WL(n-1)}=c_{n-1}$, $V_{BL0\sim(n-2)}=0$, $V_{BL(n-1)}=\overline{s_{n-1}^*}$, $V_{SL0\sim(n-2)}=0$ and $V_{SL(n-1)}=s_{n-1}^*$ to calculate $s_{n-1}=a_{n-1}\oplus b_{n-1}\oplus c_{n-1}$ and store $s_{n-1}$ in $R_{n-1}$ of the 1T1R array $E_3$; and inputting logic signals $V_{WL0c\sim(n-1)c}=0$, $V_{WLnc}=1$, $V_{BL0c\sim nc}=a_{n-1}$ and $V_{SL0c\sim nc}=\overline{b_{n-1}}$ to calculate $c_n=a_{n-1}\cdot b_{n-1}+a_{n-1}\cdot c_{n-1}+c_{n-1}\cdot b_{n-1}$ and store $c_n$ in $R_{nc}$ of the 1T1R array $E_2$.

14. An operation circuit based on the computing array according to claim 6 for implementing a 2-bit data selector, in which a logic signal a, a logic signal b and a control signal Sel are input to output the logic signal a or the logic signal b by controlling a value of the control signal Sel, comprising: a 1T1R array F, wherein the 1T1R array F includes one 1T1R device R, a word line signal corresponding to R is $V_{WL}$, a bit line signal corresponding to R is $V_{BL}$, and a source line signal corresponding to R is $V_{sL}$.

15. An operating method based on the operation circuit according to claim 14, comprising:

(S4-1) inputting logic signals $V_{WL}=1$, $V_{BL}=a$ and $V_{SL}=\overline{a}$ to initialize the 1T1R device R, and write the input logic signal a into R of the 1T1R array F; and (S4-2) inputting logic signals $V_{WL}=$Sel, $V_{BL}=b$ and $V_{SL}=\overline{b}$ to input the logic signal b and the control signal Sel so as to select an output logic signal out, wherein the logic signal a and the logic signal b represent only two independent logic signals; when the control signal Sel=0, the output signal out=a; and when the control signal Sel=1, the output signal out=b.

16. An operation circuit based on the computing array according to claim 6 for implementing a multi-bit carry select adder, in which sums $s_{0\sim n-1}$ and carry information $c_n$ are calculated according to input data $a_{0\sim n-1}$ and $b_{0\sim n-1}$ and carry information $c_0$, n represents the number of bits of the operation data, and in the calculation process, according to the carry information of each bit, an XNOR operation result or an XOR operation result of the corresponding bit of the operation data is selected as bit information of the sum, comprising: a 1T1R array $G_1$, a 1T1R array $G_2$ and a 1T1R array $G_3$; the 1T1R array $G_1$ includes n 1T1R devices $R_{0x}\sim R_{(n-1)x}$ for calculating and storing XNOR operation results of data $a_{0\sim n-1}$ and $b_{0\sim n-1}$ ($X_{0\sim n-1}=a_{0\sim n-1}$ XNOR $b_{0\sim n-1}$), word line control signals corresponding to $R_{0x}\sim R_{(n-1)x}$ are respectively $V_{WL0x}\sim V_{WL(n-1)x}$, bit line control signals corresponding to $R_{0x}\sim R_{(n-1)x}$ are respectively $V_{BL0x}\sim V_{WL(n-1)x}$, and source line control signals corresponding to $R_{0x}\sim R_{(n-1)x}$ are respectively $V_{SL0x}\sim V_{SL(n-1)x}$; the 1T1R array $G_2$ includes (n+1) 1T1R devices $R_{0c}\sim R_{nc}$ for calculating carry data $c_i$, i is an integer from 0 to n, word line control signals corresponding to $R_{0c}\sim R_{nc}$ are respectively $V_{WL0c}$~$V_{WLnc}$, bit line control signals corresponding to $R_{0c}$~$R_{nc}$ are respectively $V_{BL0c}$~$V_{BLnc}$, and source line control signals corresponding to $R_{0c}$~$R_{nc}$ are respectively $V_{SL0c}$~$V_{SL0c}$; the 1T1R array $G_3$ includes n 1T1R devices $R_0$~$R_{n-1}$ for calculating and storing addition operation results $s_{0\sim n-1}$, word line control signals corresponding to $R_0$~$R_{n-1}$ are respectively $V_{WL0}$~$V_{WL(n-1)}$, bit line control signals corresponding to $R_0$~$R_{n-1}$ are respectively $V_{BL0}$~$V_{BL(n-1)}$, and source line control signals corresponding to $R_0$~$R_{n-1}$ are respectively $V_{SL0}$~$V_{SL(n-1)}$; and the XNOR operation results $X_{0\sim n-1}$ calculated by the 1T1R array $G_1$ and the carry information $c_i$ calculated by the 1T1R array $G_2$ are converted by the signal amplifier and the control signal modem, and then transmitted to the 1T1R array $G_3$ through the data transmission circuit.

17. An operating method based on the operation circuit according to claim 16, comprising:
(S5-1) inputting logic signals $V_{WL0x\sim(n-1)x}=1$, $V_{BL0x\sim(n-1)x}=\overline{b_{0\sim n-1}}$ and $V_{SL0x\sim(n-1)x}=b_{0\sim n-1}$ to store the result $\overline{b_{0\sim n-1}}$ of inverting the input operation data $b_{0\sim n-1}$ in $R_{0x\sim(n-1)x}$ of the 1T1R array G1; inputting logic signals $V_{WL0c\sim=1}$, $V_{BL0c\sim nc}=c_0$ and $V_{SL0c\sim nc}=\overline{c_0}$ to store $c_0$ in $R_{0c\sim nc}$ of the 1T1R array $G_2$; inputting logic signals $V_{WL0\sim(n-1)}=1$, $V_{BL0\sim(n-1)}a_{0\sim n-1}$ and $V_{SL0\sim(n-1)}=\overline{a_{0\sim n-1}}$ to store the input operational data $a_{0\sim n-1}$ in $R_{0\sim n-1}$ of the 1T1R array $G_3$;
(S5-2) inputting logic signals $V_{WL0x\sim(n-1)x}=a_{0\sim n-1}$, $V_{BL0x\sim(n-1)x}=b_{0\sim n-1}$ and $V_{SL0x\sim(n-1)x}=\overline{b_{0\sim n-1}}$ to calculate XNOR operation results $X_{0\sim n-1}=a_{0\sim n-1}$ XNOR $b_{0\sim n-1}$ of the calculated data $a_{0\sim n-1}$ and $b_{0\sim n-1}$ and store $X_{0\sim n-1}$ in $R_{0x\sim(n-1)x}$ of the 1T1R array $G_1$; inputting logic signals $V_{WL0c}=0$, $V_{WL1c\sim nc}=1$, $V_{BL0c\sim nc}=a_0$ and $V_{SL0c\sim nc}=\overline{b_0}$ to calculate $c_1=a_0 \cdot b_0+a_0 \cdot c_0+c_0 \cdot b_0$ and store $c_1$ in $R_{1c\sim nc}$ of the 1T1R array $G_2$; inputting logic signals $V_{WL0\sim(n-1)}=b_{0\sim n-1}$, $V_{BL0\sim(n-1)}=a_{0\sim n-1}$ and $V_{SL0\sim(n-1)}=\overline{a_{0\sim n-1}}$ to calculate XOR operation results $s_{0\sim n-1}^*=a_{0\sim n-1} \oplus b_{0\sim n-1}$ and store $s_{0\sim n-1}^*$ in $R_{0\sim n-1}$ of the 1T1R array $G_3$;
(S5-3) inputting logic signals $V_{WL0c\sim 1c}=0$, $V_{WL2c\sim nc}=1$, $V_{BL0c\sim nc}=a_1$ and $V_{SL0c\sim nc}=\overline{b_0}$ to calculate $c_2=a_1 \cdot b_1+a_1 \cdot c_1+c_1 \cdot b_1$ and store $c_2$ in $R_{2c\sim nc}$ of the 1T1R array $G_2$; inputting logic signals $V_{WL0}=c_0$, $V_{WL1}=c_1$, $V_{WL2\sim(n-1)}=0$, $V_{BL0\sim(n-1)}=X_{0\sim n-1}$ and $V_{SL0\sim(n-1)}=\overline{X_{0\sim n-1}}$ to calculate $s_0$ and $s_1$, and store $s_0$ in $R_0$ of the 1T1R array $G_3$ and $s_1$ in $R_1$ of the 1T1R array $G_3$; when $c_0=0$, $s_0=a_0 \oplus b_0$, and when $c_1=0$, $s_0=\overline{a_0 \oplus b_0}$; when $c_1=0$, $s_1=a_1 \oplus b_1$, and when $c_1=1$, $s_1=\overline{a_1 \oplus b_1}$;
(S5-4) denoting the i-th bit in the operation data or operation result by i, and giving i an initial value of i=2;
(S5-5) inputting logic signals $V_{WL0c\sim ic}=0$, $V_{WL(i+1)c}=1$, $V_{BL0c\sim nc}=a_i$ and $V_{SL0c\sim nc}=\overline{b_i}$ to calculate $c_{i+1}=a_i \cdot b_i+a_i \cdot c_i+c_i \cdot b_i$ and store $c_{i+1}$ in $R_{(i+1)c\sim nc}$ of the 1T1R array $G_2$; inputting logic signals $V_{WL0\sim(i-1)}=0$, $V_{WLi}=c_i$, $V_{WL(i+1)\sim(n-1)}=0$, $V_{BL0\sim(n-1)}=X_{0\sim n-1}$ and $V_{SL0\sim(n-1)}=\overline{X_{0\sim n-1}}$ to calculate $s_i$ and store $s_i$ in $R_i$ of the 1T1R array $G_3$; when $c_i=0$, $s_i=a_i \oplus b_i$, and when $c_i=1$, $s_i=\overline{a_i \oplus b_i}$;
(S5-6) incrementing the value of i by 1, and if i<n−1, proceeding to the step (S5-5); otherwise, proceeding to a step (S5-7); and
(S5-7) inputting logic signals $V_{WL0c\sim(n-1)c}=0$, $V_{WLnc}=1$, $V_{BL0\sim nc}=a_{n-1}$ and $V_{SL0c\sim nc}=\overline{b_{n-1}}$ to calculate $c_n=a_{n-1} \cdot b_{n-1}+a_{n-1} \cdot c_{n-1}+c_{n-1} \cdot b_{n-1}$ and store $c_n$ in $R_{nc}$ of the 1T1R array $G_2$; inputting logic signals $V_{WL0\sim(n-2)}=0$, $V_{WL(n-1)}=c_{n-1}$, $V_{BL0\sim(n-1)}=X_{0\sim n-1}$ and $V_{SL0\sim(n-1)}=\overline{X_{0\sim n-1}}$ to calculate $s_{n-1}$ and store $s_{n-1}$ in $R_{n-1}$ of the 1T1R array $G_3$; when $c_{n-1}=0$, $s_{n-1}=a_{n-1} \oplus b_{n-1}$, and when $c_{n-1}=1$, $s_7=\overline{a_{n-1} \oplus b_{n-1}}$.

18. An operation circuit based on the computing array according to claim 6 for implementing a multi-bit pre-calculation adder, in which sums $s_{0\sim n-1}$ and carry information $c_n$ are calculated according to input data $a_{0\sim n-1}$ and $b_{0\sim n-1}$ and carry information $c_0$, and n represents the number of bits of the operation data, comprising: a 1T1R array $H_1$ and a 1T1R array $H_2$; the 1T1R array $H_1$ includes (n+1) 1T1R devices $R_{0c}$~$R_{nc}$ for calculating carry data $c_i$, i is an integer from 0 to n, word line control signals corresponding to $R_{0c}$~$R_{nc}$ are respectively $V_{WL0c}$~$V_{WLnc}$, bit line control signals corresponding to $R_{0c}$~$R_{nc}$ are respectively $V_{BL0c}$~$V_{BLnc}$, and source line control signals corresponding to $R_{0c}$~$R_{nc}$ are respectively $V_{SL0c}$~$V_{SLnc}$; the 1T1R array $H_2$ includes n 1T1R devices $R_0$~$R_{n-1}$ for calculating and storing addition operation results $s_{0\sim n-1}$, word line control signals corresponding to $R_0$~$R_{n-1}$ are respectively $V_{WL0}$~$V_{WL(n-1)}$, bit line control signals corresponding to $R_0$~$R_{n-1}$ are respectively $V_{BL0}$~$V_{BL(n-1)}$, and source line control signals corresponding to $R_0$~$R_{n-1}$ are respectively $V_{SL0}$~$V_{SL(n-1)}$; and the carry information $c_i$ calculated by the 1T1R array $H_1$ is converted by the signal amplifier and the control signal modem, and then transmitted to the 1T1R array $H_2$ through the data transmission circuit.

19. An operating method based on the operation circuit according to claim 18, comprising:
(S6-1) inputting logic signals $V_{WL0c\sim nc}=1$, $V_{BL0c\sim nc}=c_0$ and $V_{SL0c\sim nc}=\overline{c_0}$ to store $c_0$ in $R_{0c\sim nc}$ of the 1T1R array $H_1$; inputting logic signals $V_{WL0\sim(n-1)}=1$, $V_{BL0\sim(n-1)}=c_0$ and $V_{SL0\sim(n-1)}=\overline{c_0}$ to store the input carry information $c_0$ in $R_{0\sim n-1}$ of the 1T1R array $H_2$;
(S6-2) inputting logic signals $V_{WL0c}=0$, $V_{WL1c\sim nc}=1$, $V_{BL0c\sim nc}=a_0$ and $V_{SL0c\sim nc}=\overline{b_0}$ to calculate $c_1=a_0 \cdot b_0+a_0 \cdot c_0+c_0 \cdot b_0$ and store $c_1$ in $R_{1c\sim nc}$ of the 1T1R array $H_1$; inputting logic signals $V_{WL0\sim(n-1)}=1$, $V_{BL0\sim(n-1)}=a_0$, $V_{SL0}=b_0$ and $V_{SL1\sim(n-1)}=\overline{b_0}$ to calculate $s_0=c_0 \cdot a_0+\overline{c_0} \cdot a_0 \cdot \overline{b_0}+c_0 \cdot \overline{a_0} \cdot \overline{b_0}$ and $c_1=a_0 \cdot b_0+a_0 \cdot c_0+c_0 \cdot b_0$, and store $s_0^*$ in $R_0$ of the 1T1R array $H_2$ and $c_1$ in $R_{1\sim n-1}$ of the 1T1R array $H_2$;
(S6-3) inputting logic signals $V_{WL0c\sim 1c}=0$, $V_{WL2c\sim nc}=1$, $V_{BL0c\sim nc}=a_1$ and $V_{SL0c\sim nc}=\overline{b_1}$ to calculate $c_2=a_1 \cdot b_1+a_1 \cdot c_1+c_1 \cdot b_1$ and store $c_2$ in $R_{2c\sim nc}$ of the 1T1R array $H_1$; inputting logic signals $V_{WL0\sim(n-1)}=1$, $V_{BL0}=b_0$, $V_{BL1\sim(n-1)}=a_1$, $V_{SL0}=c_1$, $V_{SL1}=b_1$ and $V_{SL2\sim(n-1)}=\overline{b_1}$ to calculate $s_0=a_0 \oplus b_0 \oplus c_0$, $s_1=c_1 \cdot a_1+\overline{c_1} \cdot a_1 \cdot \overline{b_1}+c_1 \cdot \overline{a_1} \cdot \overline{b_1}$ and $c_2=a_1 \cdot b_1+a_1 \cdot c_1+c_1 \cdot b_1$, and store $s_0$ in $R_0$ of the 1T1R array $H_2$, $s_1$ in $R_1$ of the 1T1R array $H_2$ and $c_2$ in $R_{2\sim(n-1)}$ of the 1T1R array $H_2$;
(S6-4) denoting the i-th bit in the operation data or operation result by i, and giving i an initial value of i=1;
(S6-5) inputting logic signals $V_{WL0c\sim(i+1)c}=0$, $V_{WL(i+2)c\sim nc}=1$, $V_{BL0c\sim nc}=a_{i+1}$ and $V_{SL0c\sim nc}=\overline{b_{i+1}}$ to calculate $c_{i+2}=a_{i+1} \cdot b_{i+1}+a_{i+1} \cdot c_{i+1}+c_{i+1} \cdot b_{i+1}$ and store $c_{i+2}$ in $R_{(i+2)c\sim nc}$ of the 1T1R array $H_1$; inputting logic signals $V_{WL0\sim(i-1)}=0$, $V_{WLi\sim(n-1)}=1$, $V_{BL0\sim(i-1)}=0$, $V_{BLi}=b_i$, $V_{BL(i+1)\sim(n-1)}=a_{i+1}$, $V_{SL0\sim(i-1)}=0$, $V_{SLi}=c_{i+1}$, $V_{SL(i+1)}=b_{(i+1)}$ and $V_{SL(i+2)\sim(n-1)}=\overline{b_{i+1}}$ to calculate $s_i=a_i \oplus b_i \oplus c_i$, $s_{i+1}=c_{i+1} \cdot a_{i+1}+\overline{c_{i+1}} \cdot a_{i+1} \cdot \overline{b_{i+1}}+c_{i+1} \cdot \overline{a_{i+1}} \cdot \overline{b_{i+1}}$ and $c_{i+2}=a_{i+1} \cdot b_{i+1}+a_{i+1} \cdot c_{i+1}+c_{i+1} \cdot b_{i+1}$ and store $s_i$ in $R_i$ of the 1T1R array $H_2$, in $R_{i+1}$ of the 1T1R array $H_2$ and $c_{i+2}$ in $R_{(i+2)\sim(n-1)}$ of the 1T1R array $H_2$;
(S6-6) incrementing the value of i by 1, and if i<n−1, proceeding to the step (S6-5); otherwise, proceeding to a step (S6-7);
(S6-7) inputting logic signals $V_{WL0c\sim(n-1)c}=0$, $V_{WLnc}=1$, $V_{BL0c\sim nc}=a_{n-1}$ and $V_{SL0c\sim nc}=\overline{b_{n-1}}$ to calculate $c_n=a_{n-1} \cdot b_{n-1}+a_{n-1} \cdot c_{n-1}+c_{n-1} \cdot b_{n-1}$ and store $c_n$ in $R_{nc}$ of the 1T1R array $H_1$; inputting logic signals $V_{WL0\sim(n-3)}=0$, $V_{WL(n-2)\sim(n-1)}=1$, $V_{BL0\sim(n-3)}=0$, $V_{BL(n-2)}=b_{n-2}$, $V_{BL(n-1)}=a_{n-1}$, $V_{SL0\sim(n-3)}=0$, $V_{SL(n-2)}=c_{n-1}$ and $V_{SL(n-1)}=b_{n-1}$ to calculate $s_{n-2}=a_{n-2}\oplus b_{n-2}\oplus c_{n-2}$ and $s_{n-1}=c_{n-1}\cdot a_{n-1}+\overline{c_{n-1}}\cdot a_{n-1}\cdot \overline{b_{n-1}}+c_{n-1}$ and store $s_{n-2}$ in $R_{n-2}$ of the 1T1R array $H_2$ and $s_{n-1}'$, in $R_{n-1}$ of the 1T1R array $H_2$; and (S6-8) inputting logic signals $V_{WL0\sim(n-2)}=0$, $V_{WL(n-1)}=1$, $V_{BL0\sim(n-2)}=0$, $V_{BL(n-1)}=b_{n-1}$, $V_{SL0\sim(n-2)}=0$ and $V_{SL(n-1)}=c_n$ to calculate $s_{n-1}=a_{n-1}\oplus B_{n-1}\oplus c_{n-1}$ and store $s_{n-1}$ in $R_{n-1}$ of the 1T1R array $H_2$.

\* \* \* \* \*